(12) United States Patent
Kim et al.

(10) Patent No.: US 10,037,996 B2
(45) Date of Patent: Jul. 31, 2018

(54) SEMICONDUCTOR DEVICE INCLUDES A SUBSTRATE HAVING CONDUCTIVE CONTACT STRUCTURES THEREON

(71) Applicant: Samsung Electronics Co., Ltd., Suwon-si, Gyeonggi-do (KR)

(72) Inventors: Daeik Kim, Hwaseong-si (KR); Bong-Soo Kim, Yongin-si (KR); Jemin Park, Suwon-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/646,380

(22) Filed: Jul. 11, 2017

(65) Prior Publication Data

US 2018/0019244 A1    Jan. 18, 2018

(30) Foreign Application Priority Data

Jul. 12, 2016  (KR) ........................ 10-2016-0087821

(51) Int. Cl.
| | | |
|---|---|---|
| *H01L 27/00* | (2006.01) | |
| *H01L 27/108* | (2006.01) | |
| *H01L 21/3205* | (2006.01) | |
| *H01L 21/762* | (2006.01) | |
| *H01L 23/528* | (2006.01) | |

(Continued)

(52) U.S. Cl.
CPC .... *H01L 27/10814* (2013.01); *H01L 21/3205* (2013.01); *H01L 21/76224* (2013.01); *H01L 23/5283* (2013.01); *H01L 27/10823* (2013.01); *H01L 27/10855* (2013.01); *H01L 27/10885* (2013.01); *H01L 27/10888* (2013.01); *H01L 29/0649* (2013.01); *H01L 21/266* (2013.01); *H01L 21/32051* (2013.01);

(Continued)

(58) Field of Classification Search
CPC ........... H01L 21/3205; H01L 27/10885; H01L 27/10888; H01L 29/0649; H01L 21/76224
See application file for complete search history.

(56) References Cited

U.S. PATENT DOCUMENTS 5,270,239 A * 12/1993 Min .................. H01L 27/10864
                                                                257/E21.652
6,118,144 A *  9/2000 Kimura .................. H01L 28/87
                                                                257/296

(Continued)

FOREIGN PATENT DOCUMENTS

KR    10-2007-0098328    10/2007
KR    10-2008-0078470    8/2008

(Continued)

*Primary Examiner* — Ngan Ngo
(74) *Attorney, Agent, or Firm* — Myers Bigel, P.A.

(57) ABSTRACT

A semiconductor device includes a substrate, a bit line structure on the substrate, a first contact structure on a sidewall of the bit line structure, a second contact structure on the bit line structure and spaced apart from the first contact structure across the bit line structure, and an insulation pattern between the bit line structure and the first contact structure. The second contact structure covers at least a portion of a top surface of the bit line structure. The insulation pattern comprises a protrusion that protrudes from a sidewall of the insulation pattern that immediately adjacent to the bit line structure. The protrusion protrudes in a first direction parallel to a top surface of the substrate.

20 Claims, 32 Drawing Sheets

(51) Int. Cl.
  *H01L 29/06* (2006.01)
  *H01L 21/266* (2006.01)
  *H01L 21/3213* (2006.01)
  *H01L 23/532* (2006.01)

(52) U.S. Cl.
  CPC .. *H01L 21/32134* (2013.01); *H01L 23/53257* (2013.01); *H01L 23/53261* (2013.01)

(56) References Cited

U.S. PATENT DOCUMENTS

| | | | |
|---|---|---|---|
| 8,507,344 B2 | 8/2013 | Kim | |
| 8,835,252 B2 | 9/2014 | Moon et al. | |
| 9,099,343 B2 | 8/2015 | Kim et al. | |
| 9,257,437 B2 | 2/2016 | Park et al. | |
| 9,455,198 B1* | 9/2016 | Yu | H01L 21/82348 |
| 2004/0132251 A1* | 7/2004 | Yoshino | H01L 21/265 |
| | | | 438/267 |
| 2004/0197996 A1* | 10/2004 | Chen | H01L 21/28273 |
| | | | 438/259 |
| 2008/0258209 A1* | 10/2008 | Oyu | H01L 27/10876 |
| | | | 257/329 |
| 2009/0096015 A1* | 4/2009 | Io | H01L 27/115 |
| | | | 257/324 |
| 2010/0078702 A1* | 4/2010 | Nakao | H01L 21/28273 |
| | | | 257/321 |
| 2010/0120214 A1* | 5/2010 | Park | H01L 27/11578 |
| | | | 438/287 |
| 2014/0159194 A1* | 6/2014 | Song | H01L 29/0649 |
| | | | 257/522 |
| 2014/0264727 A1* | 9/2014 | Kim | H01L 21/76224 |
| | | | 257/516 |
| 2015/0126013 A1 | 5/2015 | Hwang et al. | |
| 2016/0027896 A1* | 1/2016 | Lee | H01L 21/76879 |
| | | | 438/197 |
| 2016/0049409 A1 | 2/2016 | Yeom et al. | |
| 2016/0064270 A1 | 3/2016 | Lee et al. | |
| 2016/0064384 A1 | 3/2016 | Park et al. | |

FOREIGN PATENT DOCUMENTS

| | | |
|---|---|---|
| KR | 10-2011-0119047 | 11/2011 |
| KR | 10-2013-0043901 | 5/2013 |
| KR | 10-2013-0125135 | 11/2013 |
| KR | 10-2014-0082281 | 7/2014 |

* cited by examiner

US 10,037,996 B2

SEMICONDUCTOR DEVICE INCLUDES A SUBSTRATE HAVING CONDUCTIVE CONTACT STRUCTURES THEREON

CROSS-REFERENCE TO RELATED APPLICATIONS

This U.S. nonprovisional patent application claims priority under 35 U.S.C § 119 of Korean Patent Application 10-2016-0087821 filed on Jul. 12, 2016, the entire contents of which are hereby incorporated by reference.

BACKGROUND

The present inventive concepts relate to semiconductor devices and, more particularly, to semiconductor devices having enhanced reliability.

Semiconductor devices may occupy an important position in the electronic industry due to their characteristics such as small size, multi-function, and/or low manufacturing cost. The semiconductor devices may be categorized as semiconductor memory devices storing logic data, semiconductor logic devices processing operations of logic data, or hybrid semiconductor devices having both memory and logic elements.

There has been an increasing demand for semiconductor devices having high speed and/or low operating voltage. The semiconductor devices have been more highly integrated for satisfying the above demands. The high integration of the semiconductor devices may result in deterioration of the reliability of the semiconductor devices. However, high reliability of the semiconductor devices may be increasingly required with advances in the electronic industry.

SUMMARY

Embodiments of the present inventive concepts provide a semiconductor device that can electrically separate components to be electrically divided.

Embodiments of the present inventive concepts provide a semiconductor device having high reliability.

The present inventive concepts, however, are not limited to the embodiments mentioned described herein.

According to some embodiments of the present inventive concepts, a semiconductor device includes a substrate having conductive contact structures thereon. The conductive contact structures respectively include a first conductive pattern and a second conductive pattern of a different material than the first conductive pattern stacked thereon. An asymmetric insulation pattern electrically isolates the conductive contact structures from one another. The asymmetric insulation pattern includes a protrusion laterally extending from a first sidewall surface thereof and into the first conductive pattern of one of the conductive contact structures. A second sidewall surface of the asymmetric insulation pattern, which is opposite the first sidewall surface, is free of protrusions and extends along the second conductive pattern of another of the conductive contact structures.

According to some embodiments of the present inventive concepts, a semiconductor device may comprise: a substrate; a bit line structure on the substrate; a first contact structure on a sidewall of the bit line structure; a second contact structure on the bit line structure and spaced apart from the first contact structure across the bit line structure; and an insulation pattern between the bit line structure and the first contact structure. The second contact structure may extend on or cover at least a portion of a top surface of the bit line structure. The insulation pattern may comprise a protrusion that protrudes from a sidewall of the insulation pattern that is the most adjacent to the bit line structure. The protrusion may protrude in a first direction parallel to a top surface of the substrate.

According to some embodiments of the present inventive concepts, a semiconductor device may comprise: a substrate; a substrate; a bit line structure on the substrate; a first contact structure on a sidewall of the bit line structure; a second contact structure on the bit line structure and spaced apart from the first contact structure across the bit line structure; and an insulation pattern between the bit line structure and the first contact structure. The second contact structure may extend on or cover at least a portion of a top surface of the bit line structure. The insulation pattern may comprise a protrusion between the bit line structure and the first contact structure. The protrusion may protrude from a bottom surface of the insulation pattern in a direction crossing a top surface of the substrate.

DETAILED DESCRIPTION OF EMBODIMENTS

Figure 1:
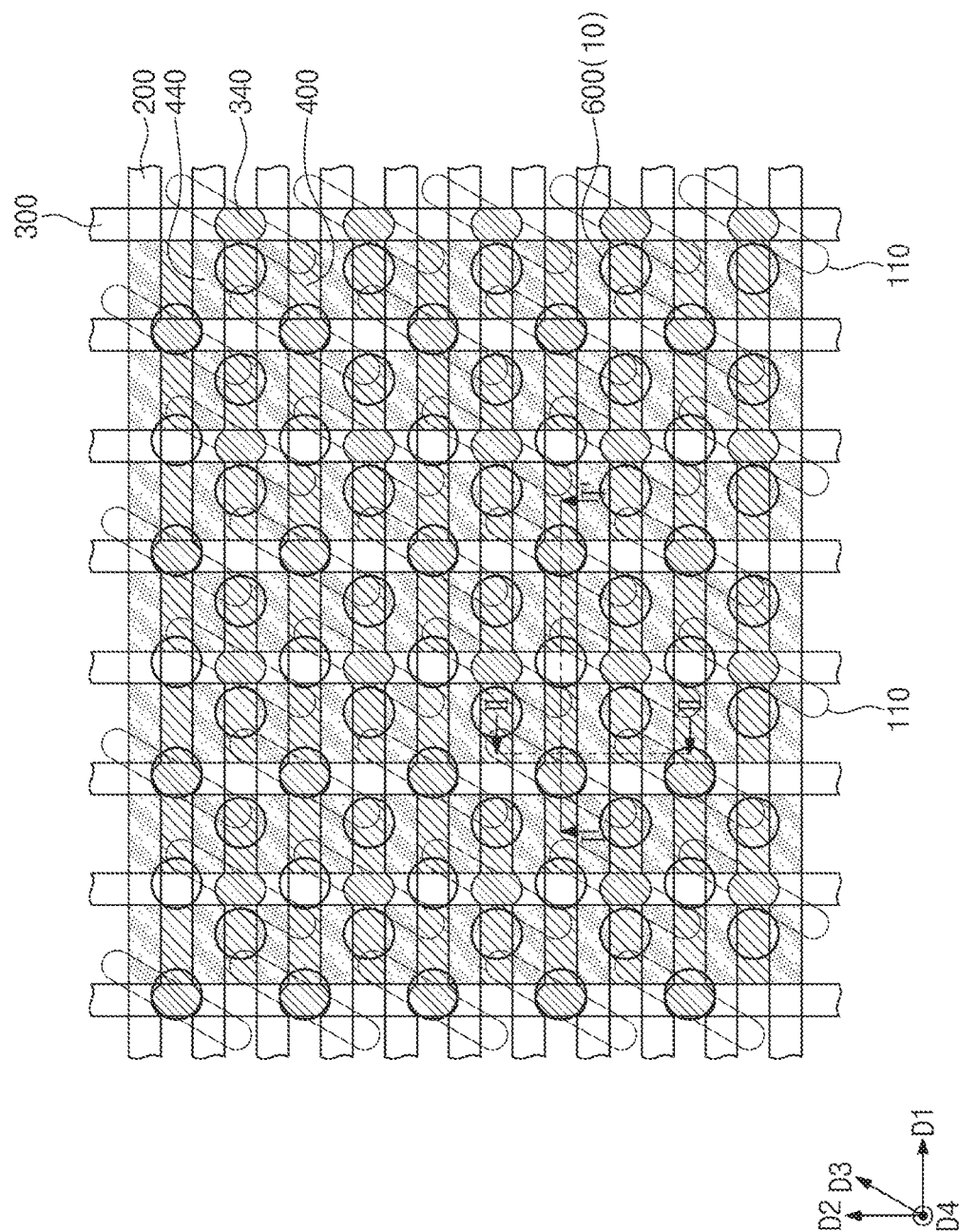
FIG. 1 is a plan view illustrating a semiconductor device according to some embodiments of the present inventive concepts.
Figure 2:
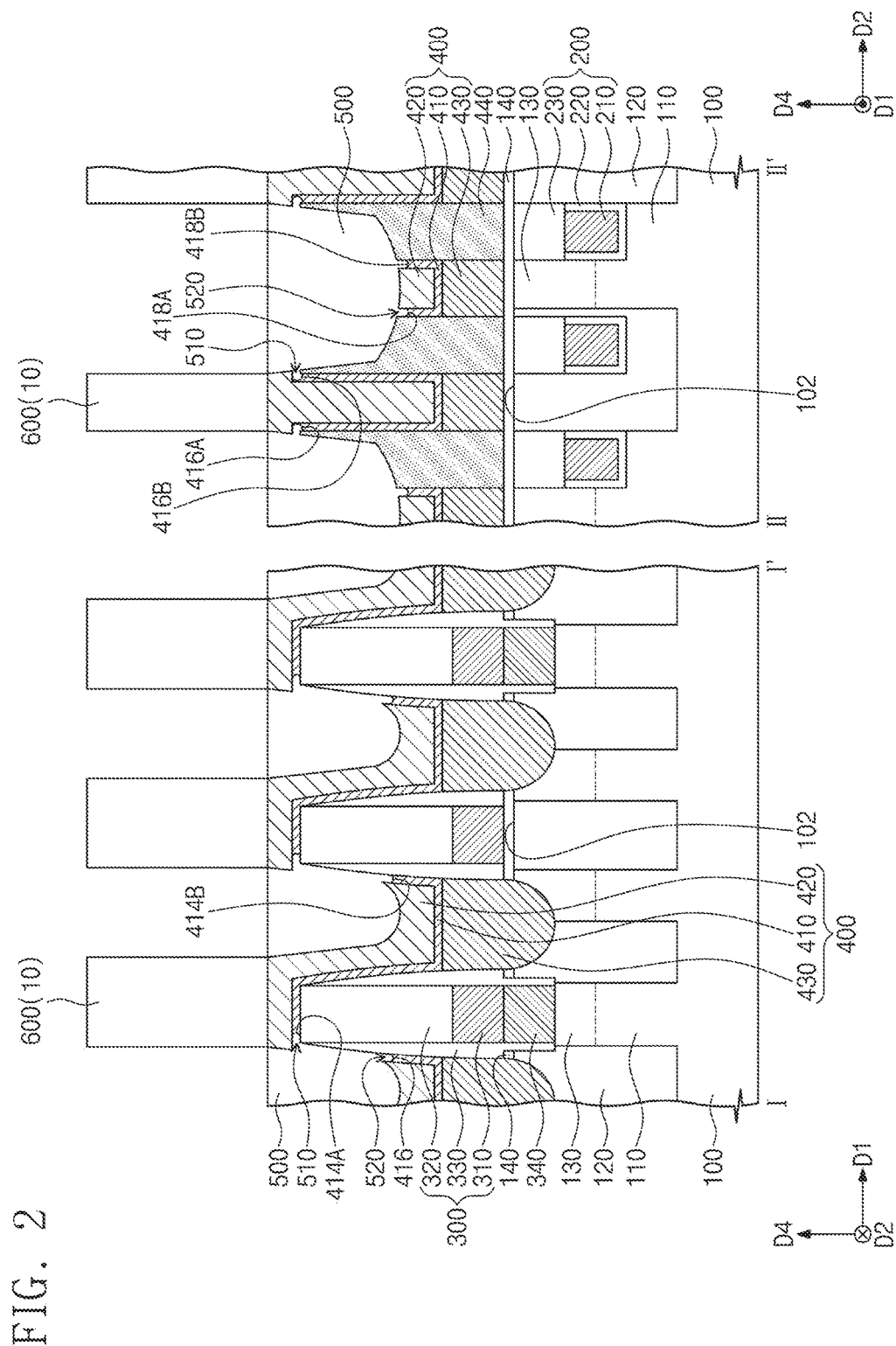
FIG. 2 shows cross-sectional views taken along lines I-I' and II-II' of FIG. 1.

FIG. 1 is a plan view illustrating a semiconductor device according to some embodiments of the present inventive concepts. FIG. 2 shows cross-sectional views taken along lines I-I' and II-II' of FIG. 1.

Referring to FIGS. 1 and 2, a substrate 100 may be provided. The substrate 100 may be a semiconductor substrate. The substrate 100 may be, for example, a bulk silicon substrate, a silicon on insulator (SOI) substrate, a germanium substrate, a germanium on insulator (GOI) substrate, a silicon-germanium substrate, or an epitaxial layer substrate obtained by performing a selective epitaxial growth (SEG).

An active region 110 may be provided in an upper portion of the substrate 100. As viewed in plan view, the active region 110 may have a bar shape extending in a third direction D3 crossing first and second directions D1 and D2. The first, second, and third directions D1, D2 and D3 may be parallel to a top surface 102 of the substrate 100. In some embodiments, a plurality of active regions 110 may be provided spaced apart from each other on the upper portion of the substrate 100.

The upper portion of the substrate 100 may be provided with a device isolation layer 120 that defines the active region 110. As viewed in plan view, the device isolation layer 120 may surround the active region 110. The device isolation layer 120 may be provided between the plurality of active regions 110. For example, the device isolation layer 120 may fill between the plurality of active regions 110. The device isolation layer 120 may include an insulative material (e.g., silicon oxide layer, silicon nitride, or silicon oxynitride).

A source/drain region 130 may be provided in the active region 110. The source/drain region 130 may have a first conductivity type. For example, the source/drain region 130 may have an n-type or p-type conductivity.

A word line structure 200 may be provided in the substrate 100. The word line structure 200 may be a buried word line structure that is buried in the substrate 100. The word line structure 200 may extend along the first direction D1. The word line structure 200 may include a word line pattern 210, a gate dielectric layer 220, and a capping pattern 230.

The word line pattern 210 may be buried within the substrate 100. For example, the word line pattern 210 may have a top surface positioned lower than the top surface 102 of the substrate 100. The word line pattern 210 may extend along the first direction D1. The word line pattern 210 may include a conductive material. For example, the word line pattern 210 may include polysilicon, doped polysilicon, metal, or metal silicide.

The gate dielectric layer 220 may be provided between the word line pattern 210 and the substrate 100. The gate dielectric layer 220 may extend along bottom and side surfaces of the word line pattern 210. The gate dielectric layer 220 may include an insulative material. In some embodiments, the gate dielectric layer 220 may be an insulation layer provided between a gate electrode and a channel. For example, the gate dielectric layer 220 may include silicon oxide, silicon oxynitride, a high-k dielectric material having a dielectric constant greater than that of silicon oxide, or any combination thereof.

The capping pattern 230 may be provided on the word line pattern 210 and the gate dielectric layer 220. The capping pattern 230 may extend along the top surface of the word line pattern 210 and a top surface of the gate dielectric layer 220. The capping pattern 230 may have a top surface coplanar with the top surface 102 of the substrate 100. The capping pattern 230 may include an insulative material. For example, the capping pattern 230 may include silicon oxide, silicon nitride, silicon oxynitride, or any combination thereof.

In some embodiments, a plurality of word line structures 200 may be provided. The plurality of word line structures 200 may be arranged along the second direction D2. For example, the plurality of word line structures 200 may be spaced apart from each other at the same interval. A single active region 110 may have therethrough a pair of word lines structures 200 directly adjacent to each other in the second direction D2.

A buffer layer 140 may be provided on the substrate 100. The buffer layer 140 may extend on or cover the top surface 102 of the substrate 100 and the top surface of the capping pattern 230. The buffer layer 140 may include a single layer or a plurality of layers. The buffer layer 140 may include an insulative material. For example, the buffer layer 140 may include silicon oxide, silicon nitride, silicon oxynitride, or any combination thereof.

A bit line node contact 340 may be provided in the active region 110. The bit line node contact 340 may be disposed between the word line structures 200 directly adjacent to each other. For example, the bit line node contact 340 may be provided in a central portion of the active region 110. The bit line node contact 340 may extend, for example, along a fourth direction D4 perpendicular to the top surface 102 of the substrate 100. The bit line node contact 340 may be electrically connected to the source/drain region 130. For example, the bit line node contact 340 may be in direct contact with the source/drain region 130 after penetrating the buffer layer 140 and a portion of the active region 110. The bit line node contact 340 may be horizontally or laterally spaced apart from the device isolation layer 120 and the buffer layer 140. As not shown in FIGS. 1 and 2, the bit line node contact 340 may be horizontally or laterally spaced apart from the active region 110. The bit line node contact 340 may have a top surface coplanar with a top surface of the buffer layer 140. The bit line node contact 340 may include a conductive material. For example, the bit line node contact 340 may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof.

In some embodiments, a plurality of bit line node contacts 340 may be provided in the active regions 110. The plurality of bit line node contacts 340 may be arranged along the second direction D2. For example, the plurality of bit line node contacts 340 may be spaced apart from each other at the same interval along the second direction D2. The plurality of bit line node contacts 340 may be arranged along the first direction D1. For example, the plurality of bit line node contacts 340 may be spaced apart from each other at the same interval along the first direction D1.

A bit line structure 300 may be provided on the substrate 100. The bit line structure 300 may extend along the second direction D2. A portion of the bit line structure 300 may be provided on the buffer layer 140. Another portion of the bit line structure 300 may be provided on the bit line node contact 340. The bit line structure 300 may include a bit line pattern 310, a capping pattern 320, and a pair of spacers 330. FIG. 2 shows the pair of spacers 330.

The bit line structure 300 may include a bit line pattern 310 provided on the bit line node contact 340. The bit line pattern 310 may extend along the second direction D2. The bit line pattern 310 may be electrically connected to the bit line node contact 340. For example, a portion of the bit line pattern 310 may be in direct contact with the bit line node contact 340. Another portion of the bit line pattern 310 may be in direct contact with the buffer layer 140. The bit line pattern 310 may include a conductive material. For example, the bit line pattern 310 may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof. In case that the bit line pattern 310 includes a metal material, the bit line pattern 310 may include tungsten (W), aluminum (Al), copper (Cu), nickel (Ni), cobalt (Co), an alloy of thereof, or any combination thereof.

Differently from that illustrated in FIG. 2, the bit line pattern 310 may include a lower bit line pattern and an upper bit line pattern on the lower bit line pattern. The lower and upper bit line patterns may include materials different from each other. For example, the lower bit line pattern may include polysilicon or doped polysilicon, and the upper bit line pattern may include metal. In some embodiments, a diffusion barrier layer may be interposed between the lower and upper bit line patterns such that it may be possible to reduce or prevent a material included in the upper bit line pattern from being diffused inside the lower bit line pattern.

The capping pattern 320 may be provided on the bit line pattern 310. The capping pattern 320 may extend in the second direction D2 along a top surface of the bit line pattern 310. The capping pattern 320 may have a thickness in the fourth direction D4. For example, the thickness of the capping pattern 320 may be greater than a thickness in the fourth direction D4 of the bit line pattern 310. The capping pattern 320 may include an insulative material. For example, the capping pattern 320 may include silicon oxide, silicon nitride, silicon oxynitride, or any combination thereof. The capping pattern 320 may include, for example, SiN.

The pair of spacers 330 may be provided on sidewalls of the bit line pattern 310 and the capping pattern 320. For example, the pair of spacers 330 may extend on or cover opposite sidewalls of the bit line pattern 310. For example, the pair of spacers 330 may extend on or cover opposite walls of the capping pattern 320. The pair of spacers 330 may extend onto sidewalls of the bit line node contact 340. The pair of spacers 330 may extend on or cover the sidewalls of the bit line node contact 340. The pair of spacers 330 may extend in the second direction D2 along the sidewalls of the bit line pattern 310 and the capping pattern 320. The pair of spacers 330 may be spaced apart from each other along the first direction D1 across the bit line pattern 310 and the capping pattern 320. Each of the pair of spacers 330 may have a width in the first direction D1. Each of the pair of spacers 330 may have a width whose size is less in an upper portion of the corresponding spacer 330 than in a lower portion of the corresponding spacer 330. For example, each of the pair of spacers 330 may have a width whose size gradually decreases along a direction from the lower portion toward the upper portion. The spacer 330 may include an insulative material. For example, the spacer 330 may include silicon oxide, silicon nitride, silicon oxynitride, or any combination thereof. The spacer 330 may include, for example, SiN.

In some embodiments, a plurality of bit line structures 300 may be provided on the substrate 100. The plurality of bit line structures 300 may be arranged in the first direction D1. For example, the plurality of bit line structures 300 may be spaced apart from each other at the same interval along the first direction D1.

Contact structures 400 and separation patterns 440 may be provided between a pair of bit line structures 300 directly adjacent to each other. The contact structures 400 and the separation patterns 440 may be alternately arranged in the second direction D2. For example, the separation patterns 440 may be arranged in the second direction D2 and may vertically overlap the word line structures 200. The contact structures 400 may be disposed between the separation patterns 440.

The separation patterns 440 may be provided on the buffer layer 140. The separation patterns 440 may extend in the fourth direction D4. Each of the separation patterns 440 may have a concave top surface. In some embodiments, an etch process may be performed to form the concave top surface of each of the separation patterns 440. The separation patterns 440 may have one sidewall whose height is greater than that of an opposite sidewall. The separation patterns 440 may include an insulative material. For example, the separation patterns 440 may include silicon oxide, silicon nitride, silicon oxynitride, or any combination thereof. The separation patterns 440 may include, for example, SiBCN, SiCN, SiOCN, SiN, or any combination thereof.

The contact structure 400 may include a storage node contact 430, a first conductive pattern 410, and a second conductive pattern 420. The contact structure 400 may have a lower portion provided in the substrate 100. For example, the lower portion of the contact structure 400 may be disposed in an area formed when the upper portion of the substrate 100 is recessed. The contact structure 400 may extend along a sidewall of one of a pair of spacers 330 directly adjacent to each other and thus extend on or cover a top surface of the bit line structure 300. The bit line structure 300 whose top surface is covered with the contact structure 400 may be one of a pair of bit line structures 300 directly adjacent to the contact structure 400. One of the pair of spacers 330 may be a spacer 330 included in one of the pair of bit line structures 300.

The storage node contact 430 may be disposed between the word line structures 200 directly adjacent to each other. The storage node contact 430 may penetrate the buffer layer 140 and a portion of the substrate 100. The storage node contact 430 may have a lower portion provided in the substrate 100. The storage node contact 430 may be electrically connected to the source/drain region 130. For example, the storage node contact 430 may be in direct contact with the source/drain region 130. The storage node contact 430 may extend in the fourth direction D4 and thus extend on or cover lower sidewalls of a pair of spacers 330 directly adjacent to the storage node contact 430. The storage node contact 430 may have a top surface parallel to the top surface 102 of the substrate 100, but the present inventive concepts is not limited thereto. The storage node contact 430 may include a conductive material. For example, the storage node contact 430 may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof.

In some embodiments, a plurality of storage node contacts 430 may be provided between a pair of bit line structures 300 directly adjacent to each other. The plurality of storage node contacts 430 may be arranged along the second direction D2. For example, the plurality of storage node contacts 430 may be spaced apart from each other at the same interval along the second direction D2. The word line structure 200 may be disposed between a pair of storage node contacts 430 directly adjacent to and spaced apart from each other along the second direction D2.

The first conductive pattern 410 may extend on or cover the top surface of the storage node contact 430. The first conductive pattern 410 may extend along sidewalls of a pair of spacers 330 directly adjacent to the first conductive pattern 410. The first conductive pattern 410 may extend on or cover a top surface of one of a pair of bit line structures 300 directly adjacent to the first conductive pattern 410. The first conductive pattern 410 may extend on or cover a sidewall of one of the pair of spacers 330 directly adjacent to the first conductive pattern 410. The first conductive pattern 410 may extend on or cover a lower sidewall of the other of the pair of spacers 330 directly adjacent to the first conductive pattern 410. In other words, the first conductive pattern 410 may expose an upper sidewall of the other of the pair of spacers 330 directly adjacent to the first conductive pattern 410. In some embodiments, the first conductive pattern 410 may conformally extend on or cover the top surface of the bit line structure 300, the sidewalls of the spacers 330 facing each other, and the top surface of the storage node contact 430. The first conductive pattern 410 may extend along the sidewall of the separation pattern 440. For example, the first conductive pattern 410 may extend on or cover facing sidewalls of a pair of separation patterns 440 directly adjacent to each other. As not shown in FIG. 2, the first conductive pattern 410 may extend onto the top surface of the separation pattern 440. In some embodiments, the first conductive pattern 410 may conformally extend on or cover the top surface of the storage node contact 430 and facing sidewalls of a pair of separation patterns 440 directly adjacent to each other.

The first conductive pattern 410 may include a first end surface 414A and a second end surface 414B. The first end surface 414A may be directly adjacent to one of neighboring bit line structures 300. For example, the first end surface 414A may be positioned on the top surface of the one of the neighboring bit line structures 300. The second end surface 414B may be directly adjacent to the other of the neighboring bit line structures 300. For example, the second end surface 414B may be positioned on the sidewall of the spacer 330 of the other of the neighboring bit line structures 300. For example, the first and second end surfaces 414A and 414B may be spaced apart from each other along the first direction D1. The first conductive pattern 410 directly adjacent to a data storage element 600 described below may include a third end surface 416A and a fourth end surface 416B. For example, each of the third and fourth end surfaces 416A and 416B may be positioned on the top surface of the separation pattern 440. For example, the third and fourth end surfaces 416A and 416B may be spaced apart from each other along the second direction D2. The first conductive pattern 410 between neighboring data storage elements 600 may include a fifth end surface 418A and a sixth end surface 418B. For example, each of the fifth and sixth end surfaces 418A and 418B may be positioned on the sidewall of the separation pattern 440. For example, the fifth and sixth end surfaces 418A and 418B may be spaced apart from each other along the second direction D2. The first to sixth end surfaces 414A, 414B, 416A, 416B, 418A and 418B may be concave. For example, the first to sixth end surfaces 414A, 414B, 416A, 416B, 418A and 418B may be a rounded surface that projects inside the first conductive pattern 410.

The first end surface 414A may horizontally or laterally be shifted or extend, on the top surface of the bit line structure 300, away from a sidewall of the bit line structure 300 such that the top surface of the bit line structure 300 may be exposed. The third end surface 416A may horizontally or laterally be shifted or extend, on the top surface of the separation pattern 440, away from the sidewall of the separation pattern 440 such that the top surface of the separation pattern 440 may be exposed. The fifth end surface 418A may vertically be shifted or extend, on the sidewall of the separation pattern 440, below the top surface of the separation pattern 440 such that the sidewall of the separation pattern 440 may be exposed.

The second end surface 414B may be positioned, on the sidewall of the spacer 330, lower than a top surface of the spacer 330 such that the sidewall of the spacer 330 may be exposed or free of the first conductive pattern 410. The fourth end surface 416B may horizontally or laterally be shifted or extend, on the top surface of the separation pattern 440, away from the sidewall of the separation pattern 440 such that the top surface of the separation pattern 440 may be exposed. The sixth end surface 418B may vertically be shifted or extend, on the sidewall of the separation pattern 440, below the top surface of the separation pattern 440 such that the sidewall of the separation pattern 440 may be exposed.

The first conductive pattern 410 may be a diffusion barrier pattern that reduces or prevents a metal element of the second conductive pattern 420 from being diffused into the spacer 330 and the capping pattern 320 of the bit line structure 300. The first conductive pattern 410 may include a conductive material. For example, the first conductive pattern may include TiN, Ti/TiN, TiSiN, TaN, WN, or any combination thereof.

The second conductive pattern 420 may be provided on the first conductive pattern 410. The second conductive pattern 420 may extend on or cover a top surface of the first conductive pattern 410. The first and second end surfaces 414A and 414B of the first conductive pattern 410 may be exposed by the second conductive pattern 420 and the bit line structure 300. The second conductive pattern 420 may have a lower portion provided between the bit line structures 300. The lower portion of the second conductive pattern 420 may vertically overlap the storage node contact 430. The second conductive pattern 420 may extend along the first conductive pattern 410. The second conductive pattern 420 may have an upper portion vertically overlapping the bit line structure 300. The upper portion of the second conductive pattern 420 may be provided on the first conductive pattern 410 that covers the top surface of the bit line structure 300. The second conductive pattern 420 may include a first top surface parallel to the top surface 102 of the substrate 100. In some embodiments, the first top surface of the second conductive pattern 420 may vertically overlap the bit line structures 300. The second conductive pattern 420 may further include a second top surface that is concave. In some embodiments, the second top surface of the second conductive pattern 420 may vertically overlap the storage node contact 430. For example, the second top surface of the second conductive pattern 420 may be a rounded surface projecting toward the storage node contact 430.

The second conductive pattern 420 may be provided between the separation patterns 440 directly adjacent to each other. The second conductive pattern 420 may be provided between long sidewalls of facing sidewalls included in the separation patterns 440 directly adjacent to each other and between short sidewalls of the facing sidewalls included in the separation patterns 440 directly adjacent to each other. The second conductive pattern 420 may fill a space between a pair of separation patterns 440. The second conductive pattern 420 may vertically overlap the storage node contact 430. The second conductive pattern 420 may extend along the top surface of the first conductive pattern 410.

In case that the second conductive pattern 420 is provided between long sidewalls of facing sidewalls included in the separation patterns 440 directly adjacent to each other, the second conductive pattern 420 may extend onto the top surfaces of the pair of separation patterns 440. For example, the upper portion of the second conductive pattern 420 may be provided on the top surfaces of the pair of separation patterns 440. The third and fourth end surfaces 416A and 416B of the first conductive pattern 410 may be exposed by the second conductive pattern 420 and the separation pattern 440. An end of the second conductive pattern 420 may protrude laterally over or beyond an end of the first conductive pattern 410. The end of the second conductive pattern 420 may thus have a bottom surface exposed by the end of the first conductive pattern 410.

In case that the second conductive pattern 420 is provided between short sidewalls of facing sidewalls included in the separation patterns 440 directly adjacent to each other, the second conductive pattern 420 may have a top surface positioned equal to or lower than the top surfaces of the pair of separation patterns 440. The fifth and sixth end surfaces 418A and 418B of the first conductive pattern 410 may be exposed by the second conductive pattern 420 and the separation pattern 440. The end of the second conductive pattern 420 may protrude vertically over or beyond the end of the first conductive pattern 410. The end of the second conductive pattern 420 may thus have a sidewall exposed by the end of the first conductive pattern 410.

The second conductive patterns 420 may include a conductive material. For example, the second conductive pattern 420 may include doped semiconductor material (e.g., doped silicon), metal (e.g., tungsten (W), titanium (Ti), tantalum (Ta), or a combination thereof), or any combination thereof. In some embodiments, a plurality of second conductive patterns 420 may be provided on the first conductive patterns 410. The plurality of second conductive patterns 420 may be physically and electrically separated from each other.

An insulation pattern 500 may be provided between the contact structures 400. The insulation pattern 500 may fill between the contact structures 400. The insulation pattern 500 may be provided on the concave top surfaces of the second conductive patterns 420. The insulation pattern 500 may have a top surface coplanar with the top surfaces, which are parallel to the top surface 102 of the substrate 100, of the second conductive patterns 420. The insulation pattern 500 may expose the top surfaces of the second conductive patterns 420 that are parallel to the top surface 102 of the substrate 100 as stated above. As viewed in plan view, the insulation pattern 500 may surround the top surfaces of the second conductive patterns 420 that are parallel to the top surface 102 of the substrate 100. The insulation pattern 500 may include an insulative material. For example, the insulation pattern 500 may include silicon oxide, silicon nitride, silicon oxynitride, or any combination thereof.

The insulation pattern 500 may be asymmetric between adjacent bit line structures 300 in that the insulation pattern 500 may include first protrusions 510 horizontally or laterally protruding from one of the sidewalls thereof, while an opposing sidewall thereof is free of such protrusions 510. One of the first protrusions 510 may be provided between the contact structure 400 and the top surface of the bit line structure 300. Another of the first protrusions 510 may be provided between the contact structure 400 and the top surface of the separation pattern 440. The one of the first protrusions 510 may have a surface in contact with the top surface of the bit line structure 300, the first end surface 414A of the first conductive pattern 410, and the bottom surface of the end of the second conductive pattern 420. The one of the first protrusions 510 may have a convex sidewall corresponding to the first end surface 414A. The another of the first protrusions 510 may have a surface in contact with the top surface of the separation pattern 440, the third end surface 416A of the first conductive pattern 410, and the bottom surface of the end of the second conductive pattern 420. The another of the first protrusions 510 may have a convex sidewall corresponding to the third end surface 416A. The another of the first protrusions 510 may have a surface in contact with the top surface of the separation pattern 440, the fourth end surface 416B of the first conductive pattern 410, and the bottom surface of the end of the second conductive pattern 420. The another of the first protrusions 510 may have a convex sidewall corresponding to the fourth end surface 416B. Each of the first protrusions 510 may have a thickness in a direction perpendicular to its protruding direction. The thickness of each of the first protrusions 510 may be substantially the same as that of the first conductive pattern 410.

The insulation pattern 500 may include second protrusions 520 vertically protruding from a bottom surface thereof. One of the second protrusions 520 may be provided between the contact structure 400 and the sidewall of the bit line structure 300. Another of the second protrusions 520 may be provided between the contact structure 400 and the sidewall of the separation pattern 440. The one of the second protrusions 520 may have a surface in contact with the sidewall of the bit line structure 300, the second end surface 414B of the first conductive pattern 410, and the sidewall of the end of the second conductive pattern 420. The one of the second protrusions 520 may have a convex bottom surface corresponding to the second end surface 414B. The another of the second protrusions 520 may have a surface in contact with the sidewall of the separation pattern 440, the fifth end surface 418A of the first conductive pattern 410, and the sidewall of the end of the second conductive pattern 420. The another of the second protrusions 520 may have a convex bottom surface corresponding to the fifth end surface 418A. The another of the second protrusions 520 may have a surface in contact with the sidewall of the separation pattern 440, the sixth end surface 418B of the first conductive pattern 410, and the sidewall of the end of the second conductive pattern 420. The another of the second protrusions 520 may have a convex sidewall corresponding to the sixth end surface 418B. Each of the second protrusions 520 may have a thickness in a direction perpendicular to its protruding direction. The thickness of each of the second protrusions 520 may be substantially the same as that of the first conductive pattern 410.

Data storage elements 600 may be provided on the contact structures 400. In some embodiments, each of the data storage elements 600 may include a capacitor. For example, each of the data storage elements 600 may include a bottom electrode, a dielectric layer, and a top electrode that are sequentially stacked.

Figure 3:
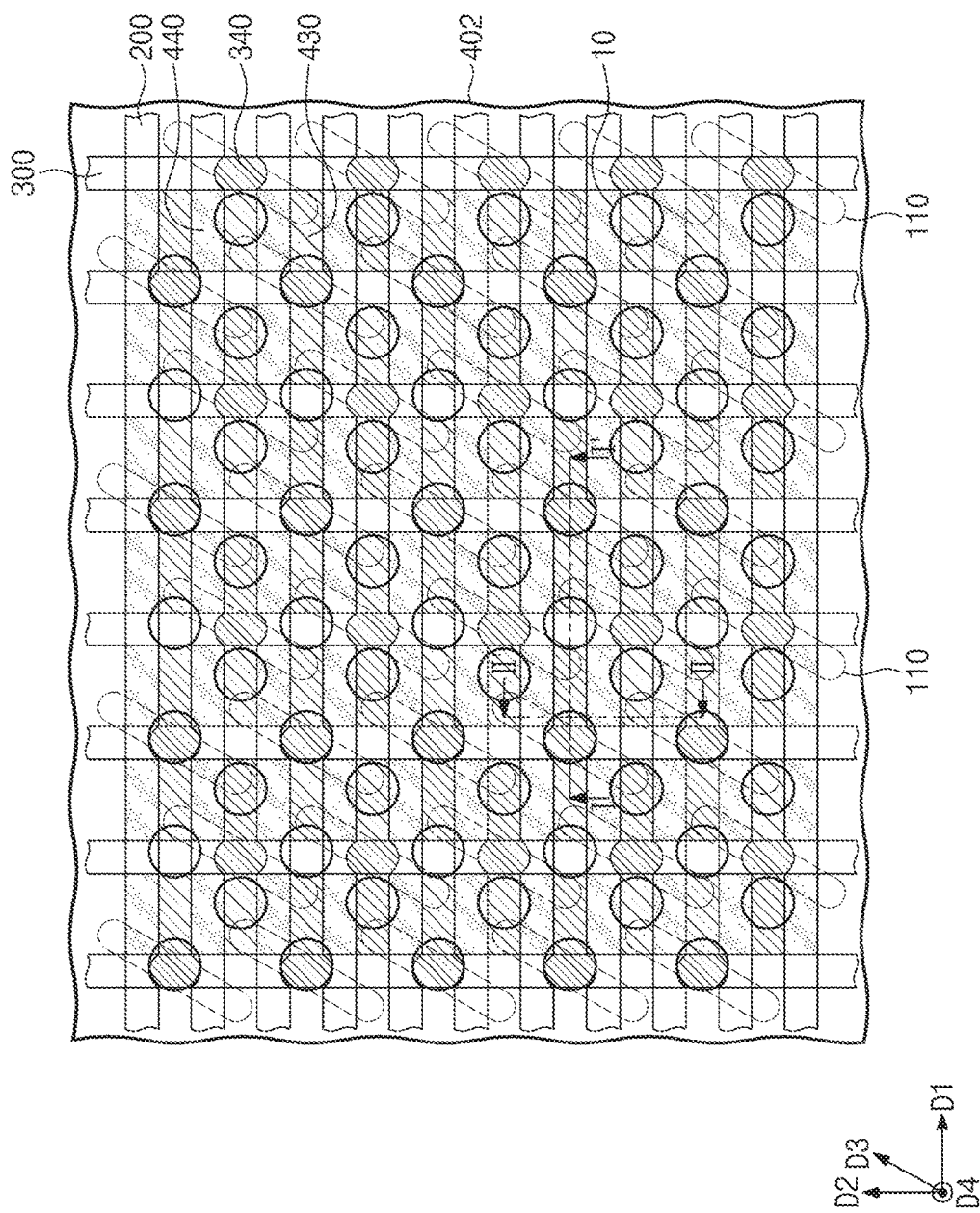
FIG. 3 is a plan view for explaining a method for manufacturing a semiconductor device according to some embodiments of the present inventive concepts.
Figure 4:
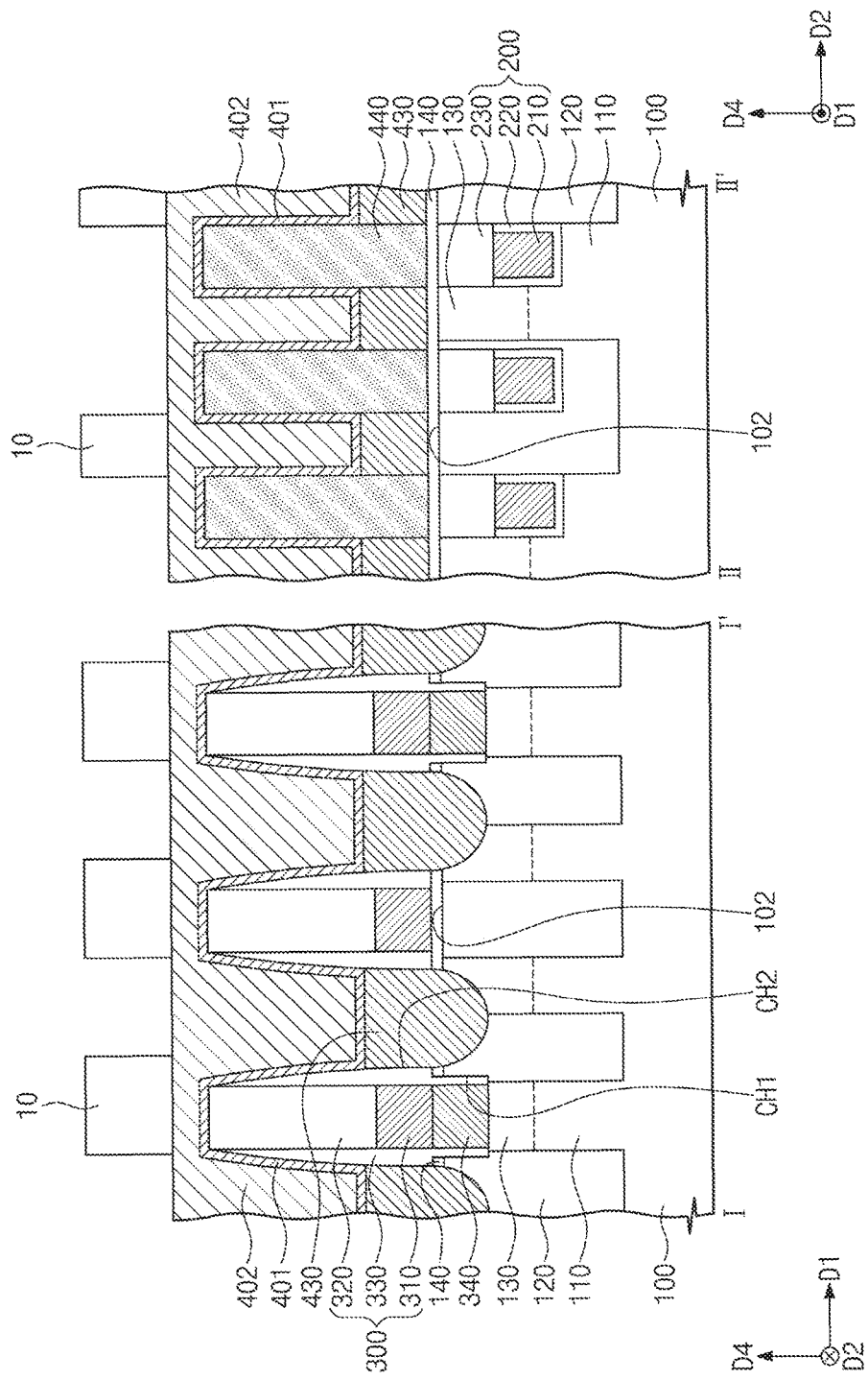
FIGS. 4 to 6 are cross-sectional views taken along lines I-I' and II-II' of FIG. 3.
Figure 5:
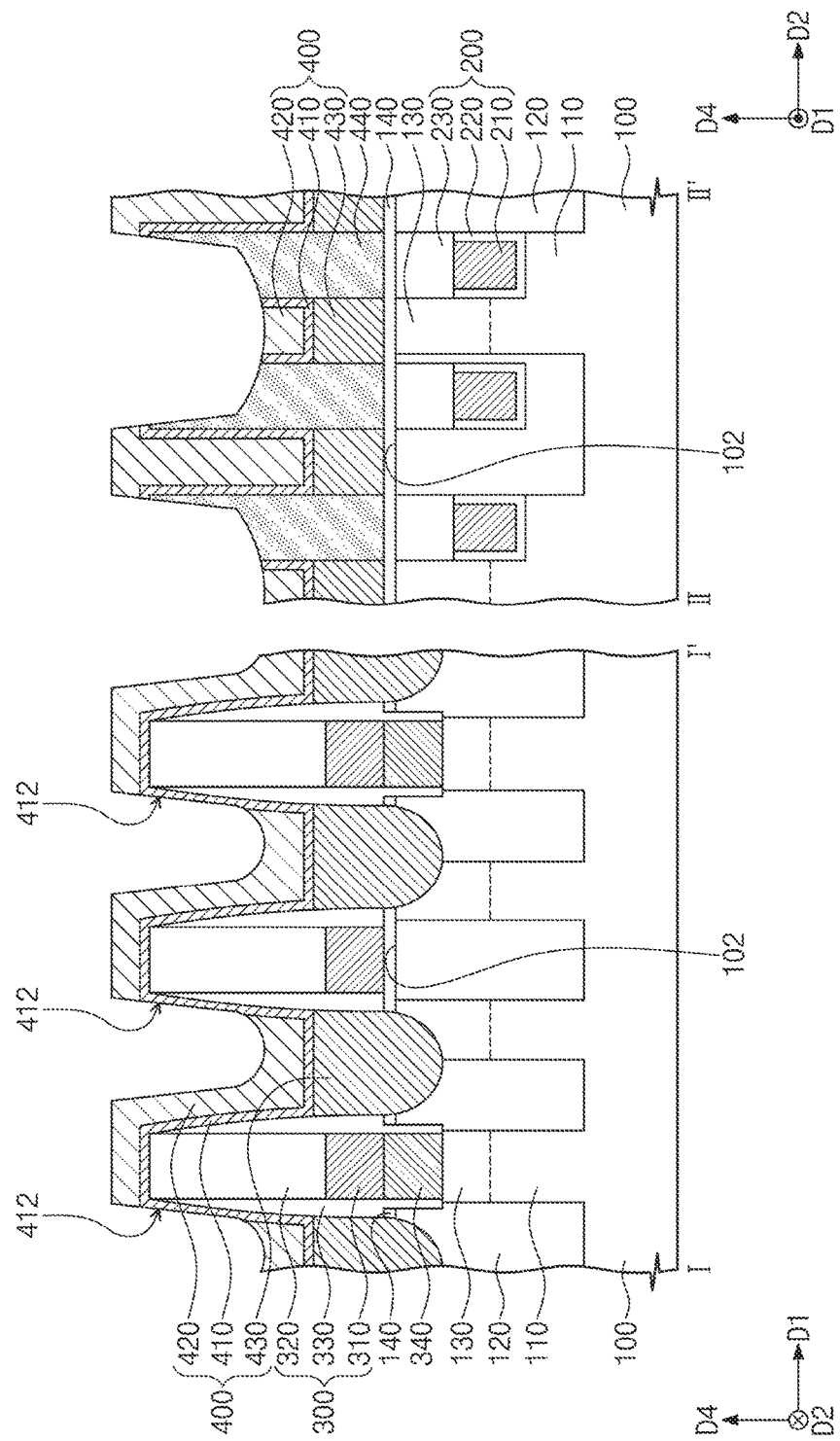
Figure 6:
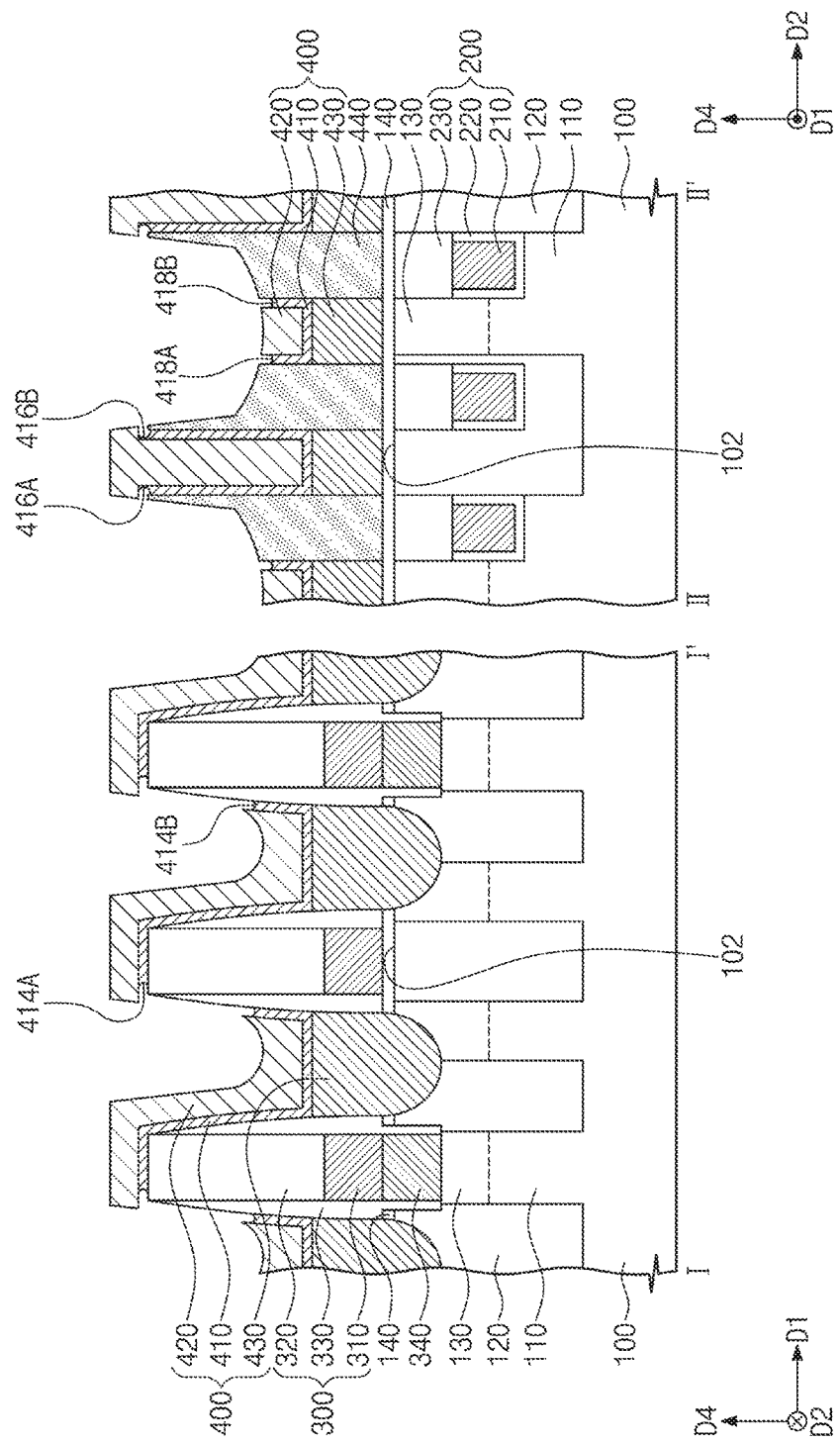

FIG. 3 is a plan view for explaining a method for manufacturing a semiconductor device according to some embodiments of the present inventive concepts. FIGS. 4, 5 and 6 are cross-sectional views taken along lines I-I' and II-II' of FIG. 3.

Referring to FIGS. 3 and 4, active regions 110 may be defined by forming a device isolation layer 120 in a substrate 100. The device isolation layer 120 may be obtained by forming trenches in the substrate 100 and then filling the trenches with an insulative material. As viewed in plan view, the active region 110 may have a bar shape extending in a third direction D3. The substrate 100 may be, for example, a bulk silicon substrate, a silicon on insulator (SOI) substrate, a germanium substrate, a germanium on insulator (GOI) substrate, a silicon-germanium substrate, or an epitaxial layer substrate obtained by performing a selective epitaxial growth (SEG). For example, the device isolation layer 120 may include silicon oxide, silicon nitride, silicon oxynitride, or any combination thereof.

A source/drain region 130 may be formed in each of the active regions 110. The source/drain region 130 may be obtained by forming an ion implantation mask on the substrate 100 and then performing an ion implantation process on the substrate 100 exposed by or through the ion implantation mask. Alternatively, the ion implantation process may be carried out without the ion implantation mask.

Word line structures 200 may be formed in the substrate 100. The formation of the word line structures 200 may include a process for forming trenches in the substrate 100 and a process for forming the word line structures 200 in the trenches. An etch process may be carried out to form the trenches. For example, the trenches may be formed by a dry etch process using an etching mask. The trenches may extend in a first direction D1. The trenches may be arranged in a second direction D2. For example, the trenches may be spaced apart from each other at the same interval along the second direction D2.

The formation of the word line structures 200 in the trenches may include a process for forming a gate dielectric layer 220, a process for forming a word line pattern 210, and a process for forming a capping pattern 230. In some embodiments, the gate dielectric layer 220 may be formed by a deposition or thermal oxidation process. The gate dielectric layer 220 may conformally extend on or cover surfaces of the trenches. The gate dielectric layer 220 may include an insulative material. For example, the gate dielectric layer 220 may include silicon oxide, silicon nitride, silicon oxynitride, or any combination thereof.

The word line pattern 210 may be formed in the trench surrounded by the gate dielectric layer 220. The word line pattern 210 may be obtained by forming on the gate dielectric layer 220 a conductive material layer filling the trench and performing an etch process on the conductive material layer so as to leave a portion of the conductive material layer in a lower portion of the trench. The word line pattern 210 may include a conductive material. For example, the word line pattern 210 may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof.

The capping pattern 230 may be formed in a remaining space of the trench. The capping pattern 230 may be formed on the word line pattern 210 and the gate dielectric layer 220, and may completely fill the trench. The capping pattern 230 may include an insulative material. For example, the capping pattern 230 may include silicon oxide, silicon nitride, silicon oxynitride, or any combination thereof.

A buffer layer 140 may be formed on the substrate 100. The buffer layer 140 may include a single layer or a plurality of layers. The buffer layer 140 may include an insulative material. For example, the buffer layer 140 may include silicon oxide, silicon nitride, silicon oxynitride, or any combination thereof.

A bit line node contact 340 may be formed in the active region 110 so as to penetrate the buffer layer 140 and the substrate 100. The formation of the bit line node contact 340 may include a process for forming a bit line node contact hole and a process for forming the bit line node contact 340 in the bit line node contact hole.

The buffer layer 140 and the substrate 100 may be partially etched to form the bit line node contact hole in the active region 110. As viewed in plan view, the bit line node contact hole may expose the source/drain region 130 disposed between a pair of word line structures 200 that overlap the active region 110. An etch process for forming the bit line node contact hole may also partially etch an upper portion of the device isolation layer 120 that is adjacent to the source/drain region 130.

A bit line node contact 340 may be formed by completely filling the bit line node contact hole. In detail, the bit line node contact 340 may be obtained by forming on the buffer layer 140 a conductive layer filling the bit line node contact hole and performing a planarization process (e.g., a chemical mechanical polishing (CMP) process or an etch back process) on the conductive layer until exposing a top surface of the buffer layer 140. The bit line node contact 340 may include a conductive material. For example, the bit line node contact 340 may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof.

Bit line structures 300 may be formed on the buffer layer 140 and the bit line node contacts 340. The formation of each of the bit line structures 300 may include a process for forming a bit line pattern 310 and a capping pattern 320 that are sequentially stacked on the buffer layer 140 and the bit line node contacts 340, and a process for forming spacers 330 covering sidewalls of the bit line pattern 310 and the capping pattern 320.

The formation of the bit line pattern 310 and the capping pattern 320 may include sequentially forming a conductive layer and an insulation layer on the buffer layer 140 and then patterning the insulation and conductive layers. For example, the conductive layer may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof. For example, the insulation layer may include silicon oxide, silicon nitride, silicon oxynitride, or any combination thereof.

The insulation layer may be patterned by an etch process using an etching mask so that the capping pattern 320 may be formed. In some embodiments, the conductive layer may be patterned by an etch process using the capping pattern 320 as an etching mask so that the bit line pattern 310 may be formed. When a process is performed to form the bit line pattern 310, the bit line node contact 340 may be partially etched to form a first contact hole CH1. The first contact hole CH1 may expose a sidewall of the bit line node contact 340, a sidewall and a top surface of the substrate 100, and a sidewall of the buffer layer 140.

The formation of the spacers 330 may include a process for forming a spacer layer conformally covering the sidewalls of the bit line node contact 340, the sidewalls of the bit line pattern 310, the sidewalls and a top surface of the capping pattern 320, the top surface of the buffer layer 140, and a surface of the first contact hole CH1 and then performing an etch back process on the spacer layer. For example, the formation of the spacer layer may be carried out using either a chemical vapor deposition process or a physical vapor deposition process. The spacer layer may include an insulative material. For example, the spacer layer may include silicon oxide, silicon nitride, silicon oxynitride, or any combination thereof.

A storage node contact 430 may be formed between a pair of bit line structures 300 directly adjacent to each other. The formation of the storage node contact 430 may include a process for forming a second contact hole CH2 between the bit line structures 300 directly adjacent to each other and forming the storage node contact 430 in the second contact hole CH2.

The formation of the second contact hole CH2 may include forming insulation patterns and separation patterns 440 that are alternately provided along the second direction D2 between a pair of bit line structures 300 directly adjacent to each other and performing a patterning process using the separation patterns 440 as an etching mask. The patterning process may etch the insulation pattern, the buffer layer 140, and an upper portion of the substrate 100. Therefore, the second contact hole CH2 may be formed between the bit line structures 300 directly adjacent to each other and between the separation patterns 440 directly adjacent to each other.

The separation patterns 440 may include a material having an etch selectivity with respect to the insulation patterns. For example, the insulation pattern may include a silicon oxide layer, a silicon nitride layer, a silicon oxynitride layer, or any combination thereof. The separation patterns 440 may include a SiBCN layer, a SiCN layer, a SiOCN layer a SiN layer, or any combination thereof. The second contact hole CH2 may expose the source/drain region 130 formed in each of end portions of the active region 110.

The formation of the storage node contact 430 in the second contact hole CH2 may include a process for forming on the bit line structure 300 a conductive layer extending inside the second contact hole CH2 and a process (e.g., an etch back process) for etching the conductive layer. The process for forming the storage node contact 430 may remove the conductive layer directly adjacent to an upper portion of the bit line structure 300. On the other hand, the process may hardly or not remove the conductive layer directly adjacent to a lower portion of the bit line structure 300. Therefore, the storage node contact 430 may be formed in a lower portion of the second contact hole CH2. For example, the conductive layer may include doped semiconductor material (e.g., doped silicon), metal (e.g., tungsten (W), titanium (Ti), tantalum (Ta), or any combination thereof), conductive metal nitride (e.g., titanium nitride, tantalum nitride, or tungsten nitride), metal-semiconductor compound (e.g., metal silicide), or any combination thereof.

First and second conductive layers 401 and 402 may be formed on the storage node contacts 430, the bit line structures 300, and separations patterns 440. The formation of the first and second conductive layers 401 and 402 may include depositing the first and second conductive layers 401 and 402 on the storage node contacts 430, the bit line structures 300, and the separation patterns 440. The first conductive layer 401 may conformally extend on or cover top surfaces of the storage node contacts 430, top surfaces and sidewalls of the bit line structures 300, top surfaces and sidewalls of the separation patterns 440. The second conductive layer 402 may be deposited on the first conductive layer 401 so as to extend on or cover a top surface of the first conductive layer 401. The first conductive layer 401 may be a diffusion barrier layer that reduces or prevents a metal element of the second conductive layer 402 from being diffused into the spacer 330 and the capping pattern 320 of the bit line structure 300. For example, the first conductive layer 401 may include TiN, Ti/TiN, TiSiN, TaN, WN, or any combination thereof. For example, the second conductive layer 402 may include doped semiconductor material (e.g., doped silicon), metal (e.g., tungsten (W), titanium (Ti), tantalum (Ta), or a combination thereof), or any combination thereof.

Etching masks 10 may be provided on a top surface of the second conductive layer 402. Each of the etching masks 10 may vertically overlap (e.g., overlap when viewed in plan view) the entire top surface of each of the capping patterns 320. The etching masks 10 may include a spin on hardmask (SOH) layer or an amorphous carbon layer (ACL). The SOH layer may be a carbon-based or silicon-based SOH layer.

Referring to FIG. 5, the second conductive layer 402, the first conductive layer 401, and the separation pattern 440 may be etched by an etch process using the etching mask 10 discussed with reference to FIGS. 3 and 4. For example, a dry etch process (e.g., an etch back process) may be performed to dry etch the first conductive layer 401, the second conductive layer 402, and the separation pattern 440. The etching of the second conductive layer 402 may form a second conductive pattern 420. The etching of the second conductive layer 402 may expose a portion 412 of the first conductive layer 401 on the sidewall of the bit line structure 300. The first conductive layer 401 may not be etched on the sidewall of the bit line structure 300. Therefore, the bit line structures 300 may not be exposed. The second conductive patterns 420 may be electrically connected to the storage node contacts 430 through the first conductive layer 401. An electrical failure may therefore occur in a semiconductor device.

Referring to FIG. 6, the portion 412 may be removed from the first conductive layer 401 discussed with reference to FIG. 5. The removal of the portion 412 from the first conductive layer 401 may include a process for isotropically etching the first conductive layer 401. For example, a wet etch process may be performed to remove the portion 412 of the first conductive layer 401. The wet etch process may use an etchant including a material that selectively removes TiN, Ti/TiN, TiSiN, TaN, WN, or any combination thereof. The isotropic etch process may remove the portion 412 of the first conductive layer 401 and thus a first conductive pattern 410 may be formed. The first conductive pattern 410 may include a first to sixth end surfaces 414A, 414B, 416A, 416B, 418A and 418B. The first to sixth end surfaces 414A, 414B, 416A, 416B, 418A and 418B may be substantially the same as the first to sixth end surfaces 414A, 414B, 416A, 416B, 418A and 418B discussed with reference to FIG. 2. The first conductive patterns 410 may be electrically separated from each other. As a result, differently from that illustrated in FIG. 5, the second conductive patterns 420 may be electrically separated from the storage node contacts 430. In this description, the storage node contact 430, the first conductive pattern 410, and the second conductive pattern 420 may be combined to constitute or define a contact structure 400.

Referring back to FIGS. 1 and 2, an insulation pattern 500 may be formed in areas that are etched by the etch process discussed with reference to FIGS. 5 and 6. The insulation pattern 500 may fill the etched areas. The formation of the insulation pattern 500 may include forming an insulation layer on a pair of contact structures 400 directly adjacent to each other and etching the insulation layer to expose top surfaces of the second conductive patterns 420 on the bit line structures 300. The insulation pattern 500 may include first protrusions 510 horizontally or laterally protruding from a sidewall of the insulation pattern 500 and second protrusions 520 vertically protruding from a bottom surface of the insulation pattern 500.

Data storage elements 600 may be provided on the contact structures 400. For example, the data storage element 600 may include a capacitor. The data storage elements 600 may be electrically connected to the second conductive patterns 420.

Figure 7:
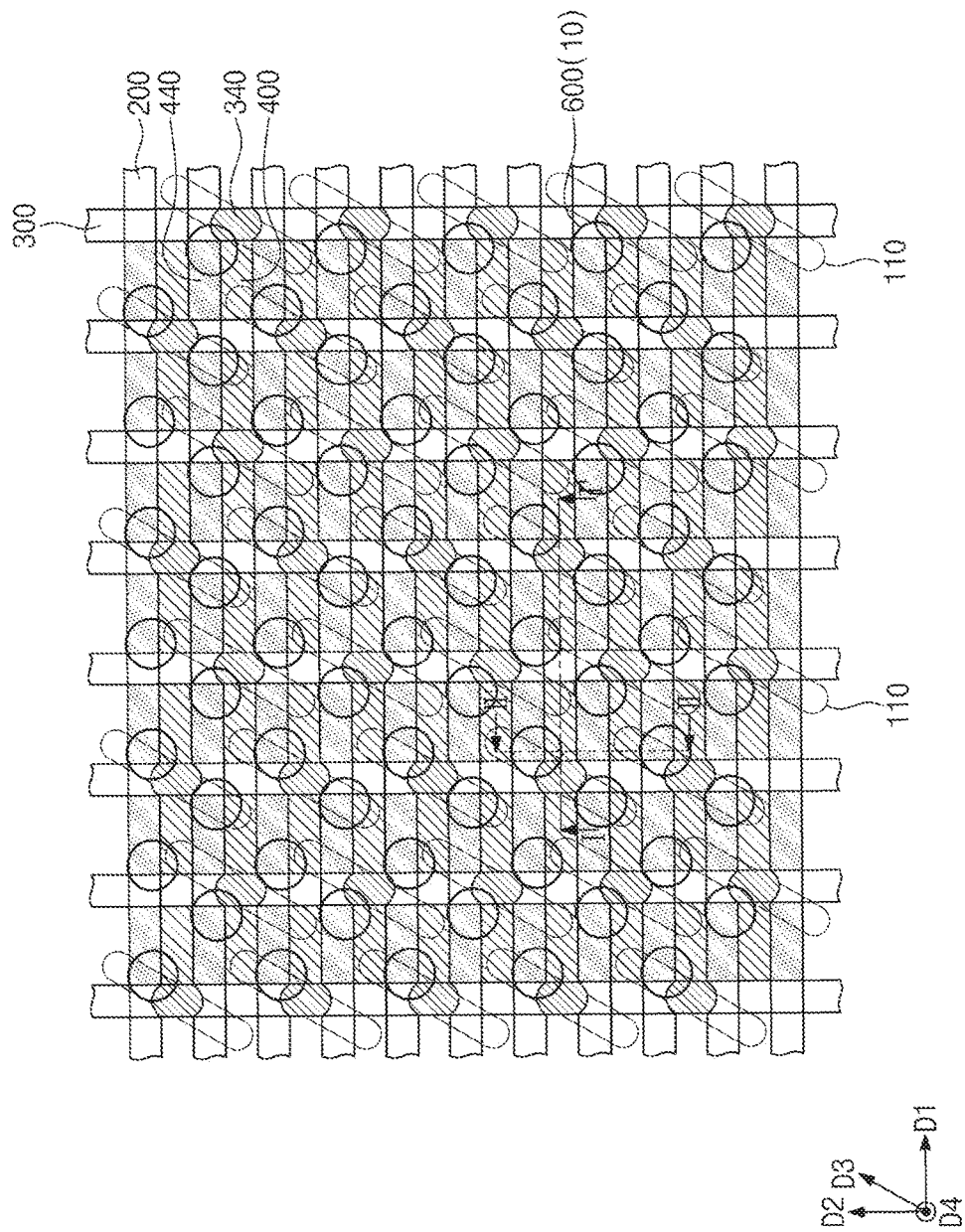
FIG. 7 is a plan view illustrating a semiconductor device according to some embodiments of the present inventive concepts.
Figure 8:
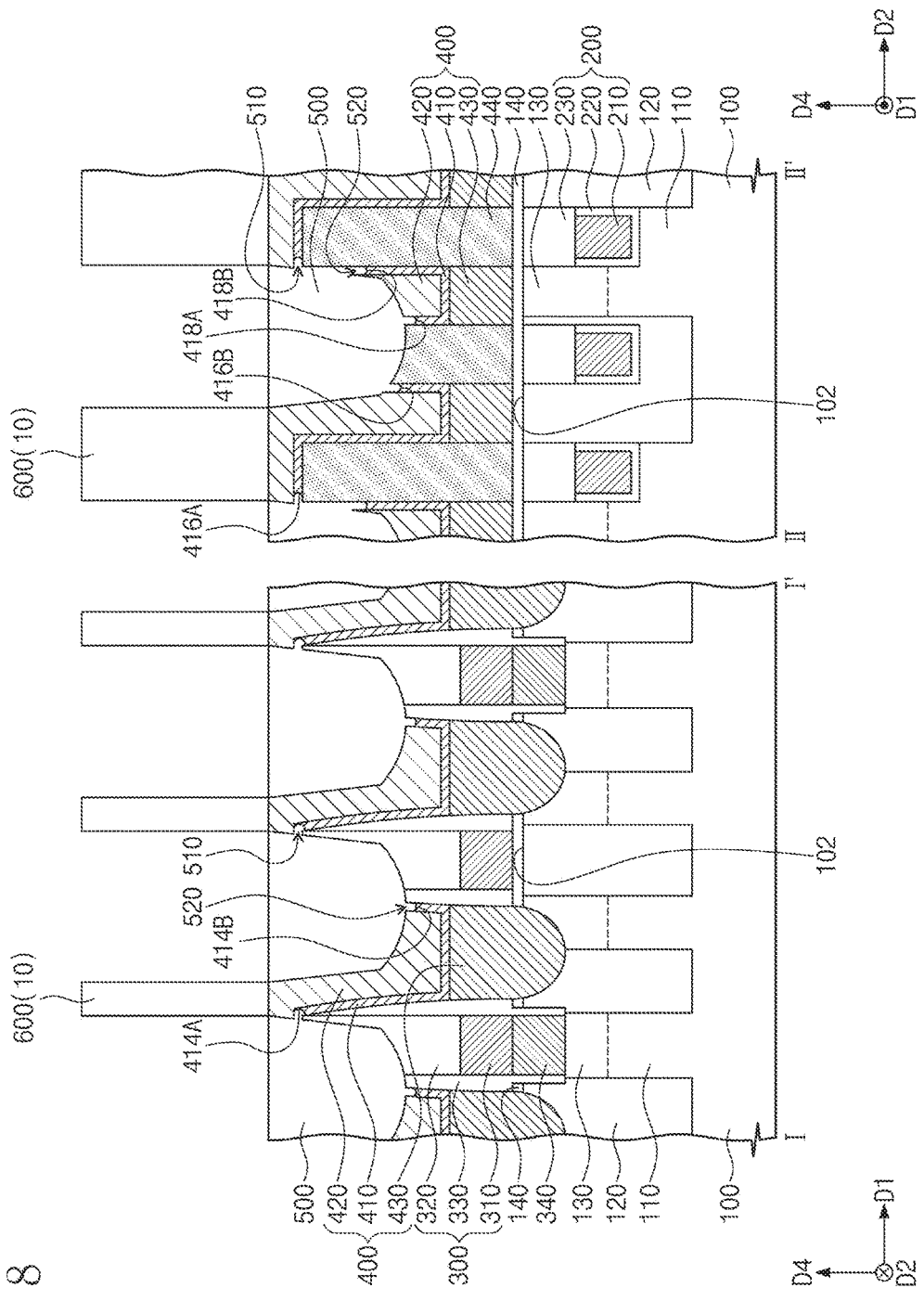
FIG. 8 shows cross-sectional views taken along lines I-I' and II-II' of FIG. 7.

FIG. 7 is a plan view illustrating a semiconductor device according to some embodiments of the present inventive concepts. FIG. 8 shows cross-sectional views taken along lines I-I' and II-II' of FIG. 7. Configurations substantially the same as those discussed with reference to FIGS. 1 and 6 may be omitted for brevity of the description. A method for manufacturing a semiconductor device that follows may be substantially the same as that discussed with reference to FIGS. 1 to 6, except for the position of the etching mask.

Referring to FIGS. 7 and 8, the etching mask 10 may vertically overlap a pair of contact structures 400 spaced apart from each other along the second direction D2 across the separation pattern 440. The etching mask 10 may vertically overlap a portion of the capping pattern 320. Differently from that shown in FIG. 5, an etch process for the second conductive layer 402 may expose the portion 412 of the first conductive layer 401 on the sidewall of each of the separation patterns 440. In other words, the first conductive layer 401 may not be etched on the sidewalls of the separation patterns 440. Therefore, the separation patterns 440 may not be exposed. The second conductive patterns 420 may be electrically connected to the storage node contacts 430 through the first conductive layer 401. An electrical failure may therefore occur in a semiconductor device. The first conductive layer 401 may be removed from the sidewalls of the separation patterns 440 by the isotropic etch process for the first conductive layer 401 discussed with reference to FIG. 6. As a result, a semiconductor device may be free of the electrical failure. Differently from that shown in FIG. 2, the fourth end surface 416B may vertically be shifted or extend, on the sidewall of the separation pattern 440, below the top surface of the separation pattern 440 such that the sidewall of the separation pattern 440 may be exposed.

Figure 9:
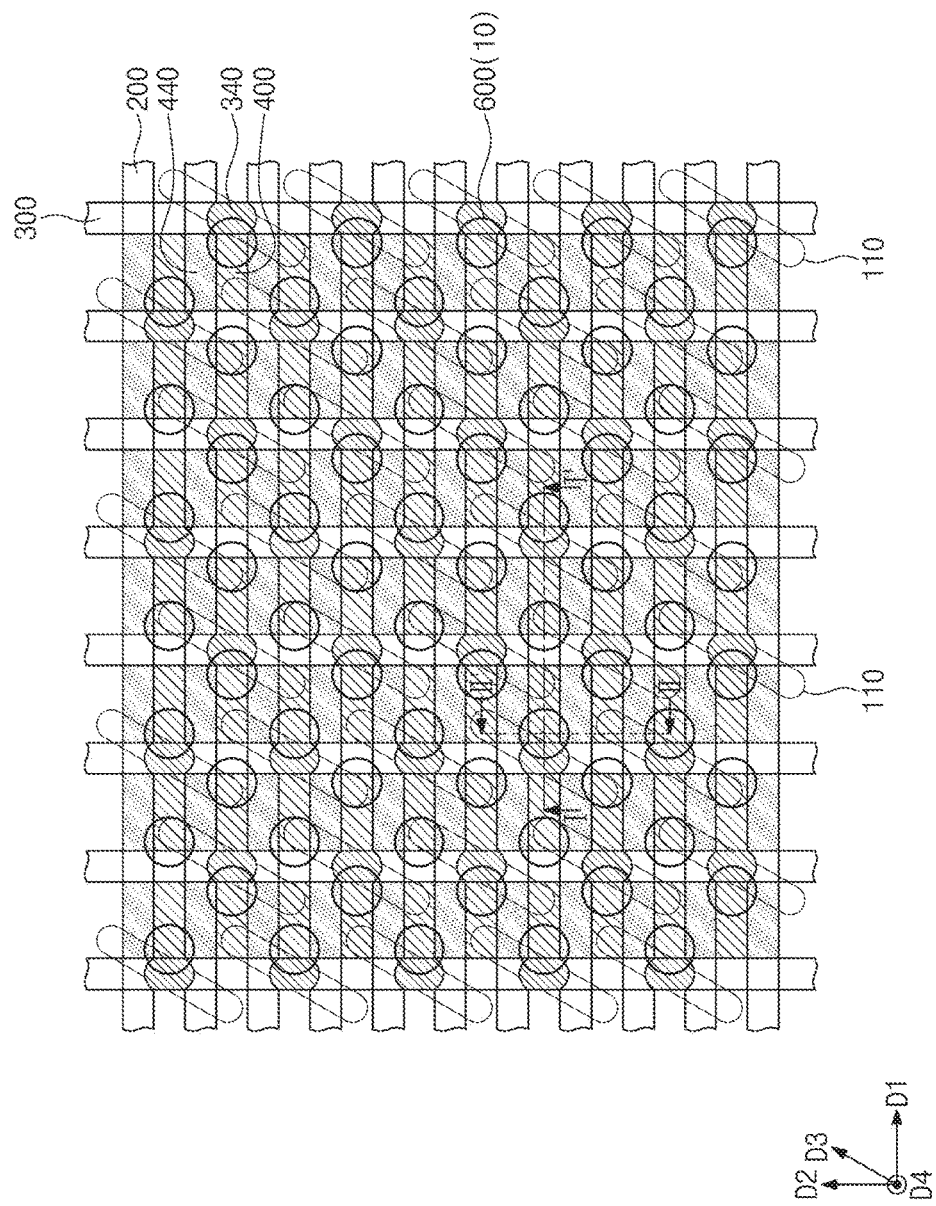
FIG. 9 is a plan view illustrating a semiconductor device according to some embodiments of the present inventive concepts.
Figure 10:
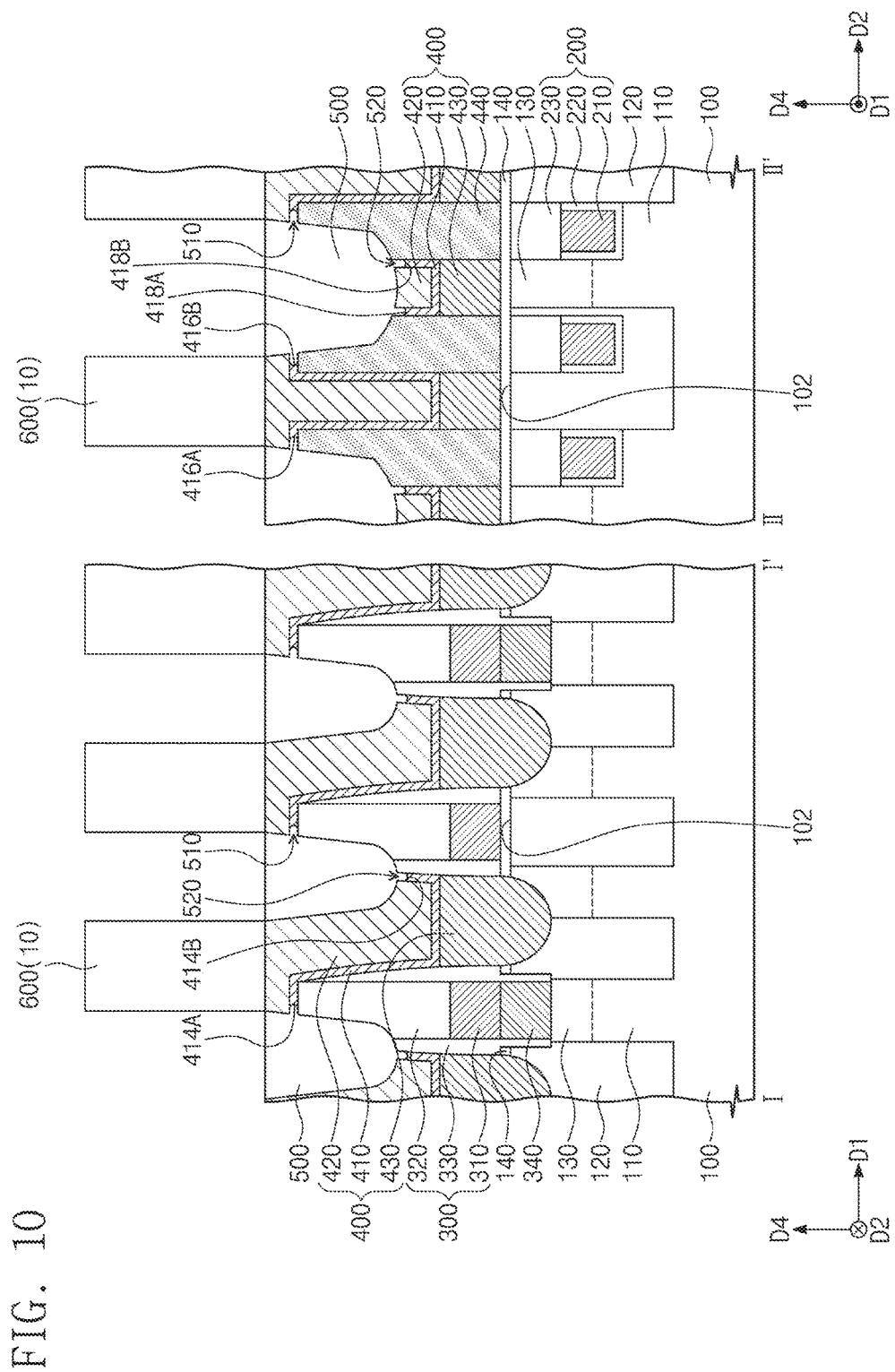
FIG. 10 shows cross-sectional views taken along lines I-I' and II-II' of FIG. 9.

FIG. 9 is a plan view illustrating a semiconductor device according to some embodiments of the present inventive concepts. FIG. 10 shows cross-sectional views taken along lines I-I' and II-II' of FIG. 9. Configurations substantially the same as those discussed with reference to FIGS. 1 and 6 may be omitted for brevity of the description. A method for manufacturing a semiconductor device that follows may be substantially the same as that discussed with reference to FIGS. 1 to 6, except for the position of the etching mask.

Referring to FIGS. 9 and 10, the etching mask 10 may vertically overlap a portion of the capping pattern 320 and a portion of the separation pattern 440. Differently from that shown in FIG. 5, the first and second conductive layers 401 and 402 may be etched to form the first and second conductive patterns 410 and 420, respectively. Thereafter, the first conductive pattern 410 may be isotropically etched. The isotropic etching of the first conductive pattern 410 may be substantially the same as the process discussed with reference to FIG. 6.

Figure 11:
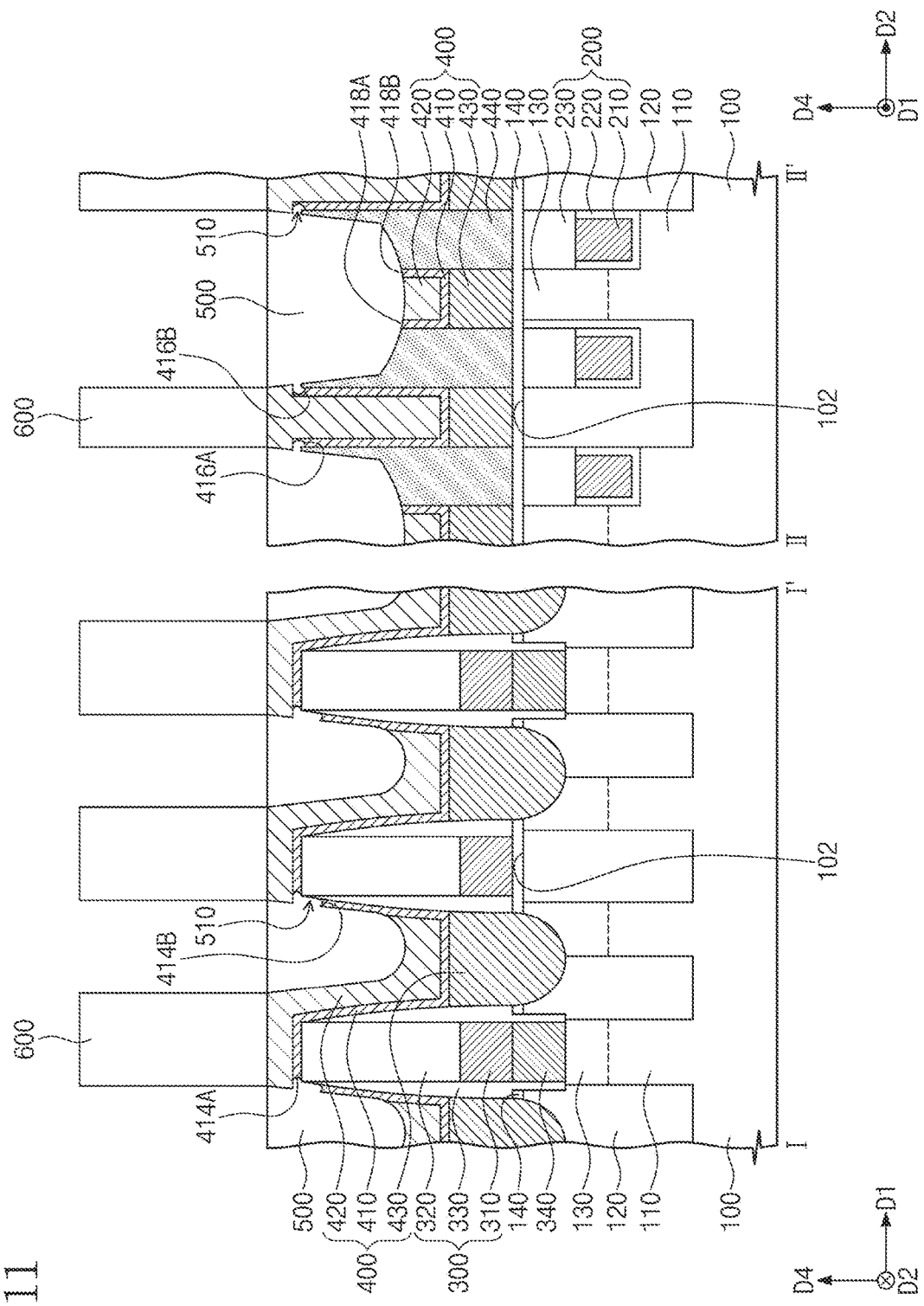
FIG. 11 shows cross-sectional views corresponding to lines I-I' and II-II' of FIG. 1 illustrating a semiconductor device according to some embodiments of the present inventive concepts.

FIG. 11 shows cross-sectional views corresponding to lines I-I' and II-II' of FIG. 1 illustrating a semiconductor device according to some embodiments of the present inventive concepts. Configurations substantially the same as those discussed with reference to FIGS. 1 and 2 may be omitted for brevity of the description.

Referring to FIGS. 1 and 11, the substrate 100 may be provided thereon with the bit line structures 300, the contact structures 400, the separation patterns 440, the insulation pattern 500, and the data storage elements 600.

Differently from that shown in FIG. 2, the fifth and end surface 418A may be coplanar with top surfaces of the separation pattern 440 and the second conductive pattern 420 directly adjacent to the fifth end surface 418A. The sixth end surface 418B may be coplanar with top surfaces of the separation pattern 440 and the second conductive pattern 420 directly adjacent to the sixth end surface 418B. Top surfaces of a pair of separation patterns 440 directly adjacent to each other may be coplanar with the fifth and sixth end surfaces 418A and 418B of the first conductive pattern 410 between short sidewalls of the pair of separation patterns 440. The insulation pattern 500 may have no second protrusions 520 vertically protruding from the bottom surface thereof. The insulation pattern 500 may include the first protrusions 510 horizontally or laterally protruding from the sidewall thereof. The first protrusion 510 may extend on or cover an upper sidewall of the spacer 330 and a portion of the top surface of the capping pattern 320.

Figure 12:
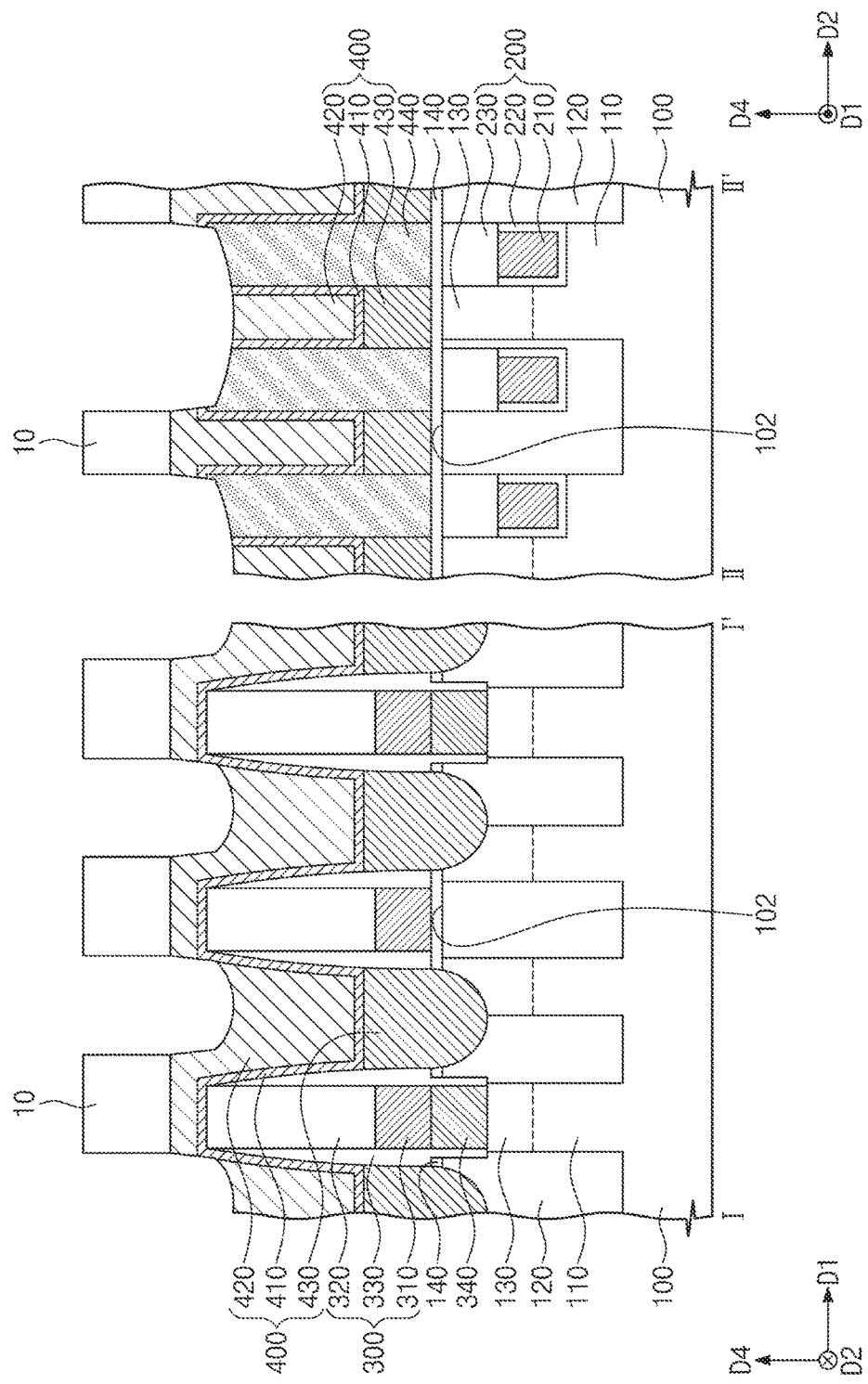
FIGS. 12 to 14 are cross-sectional views corresponding to lines I-I' and II-II' of FIG. 1 for explaining a method for manufacturing a semiconductor device according to some embodiments of the present inventive concepts.
Figure 13:
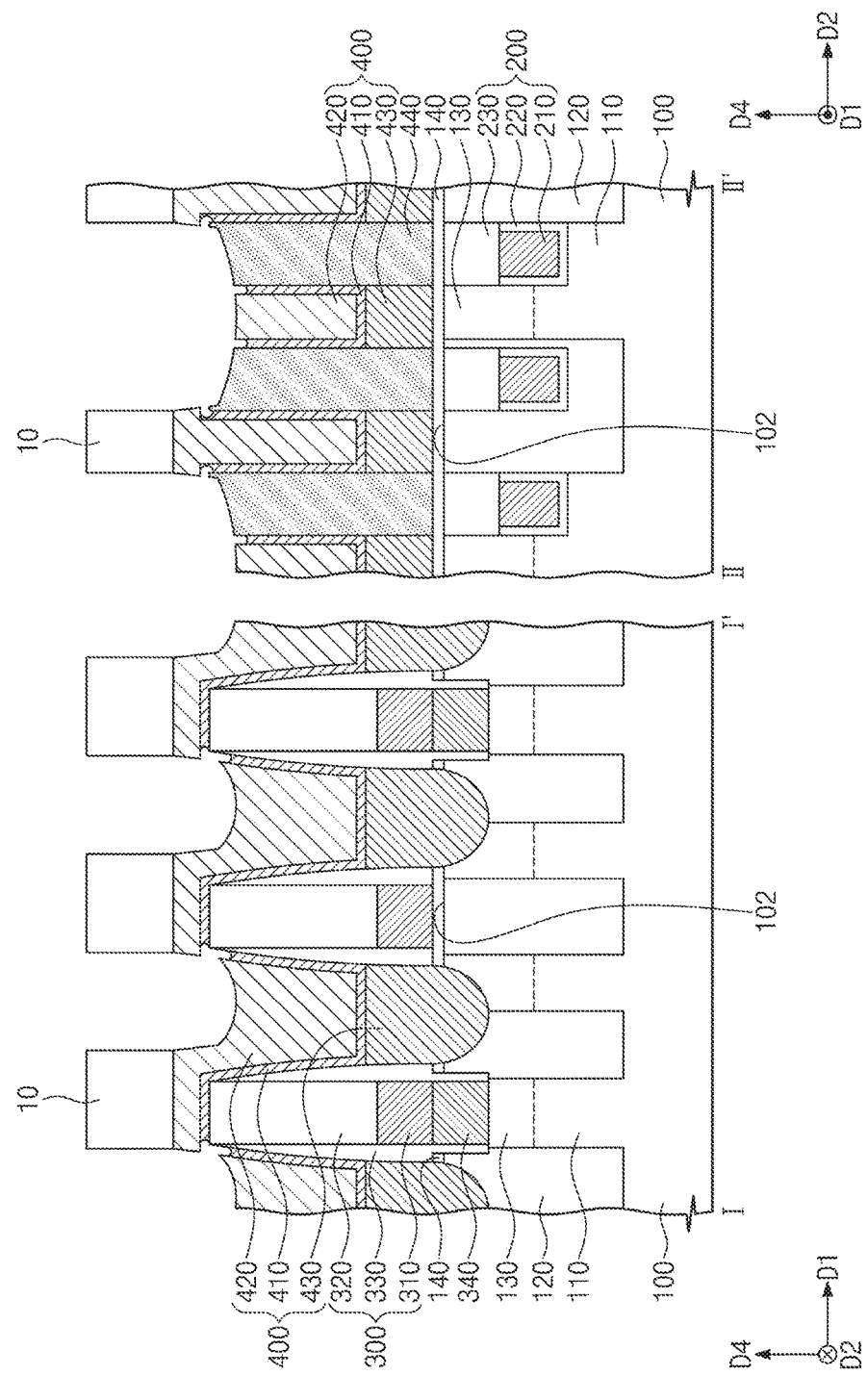
Figure 14:
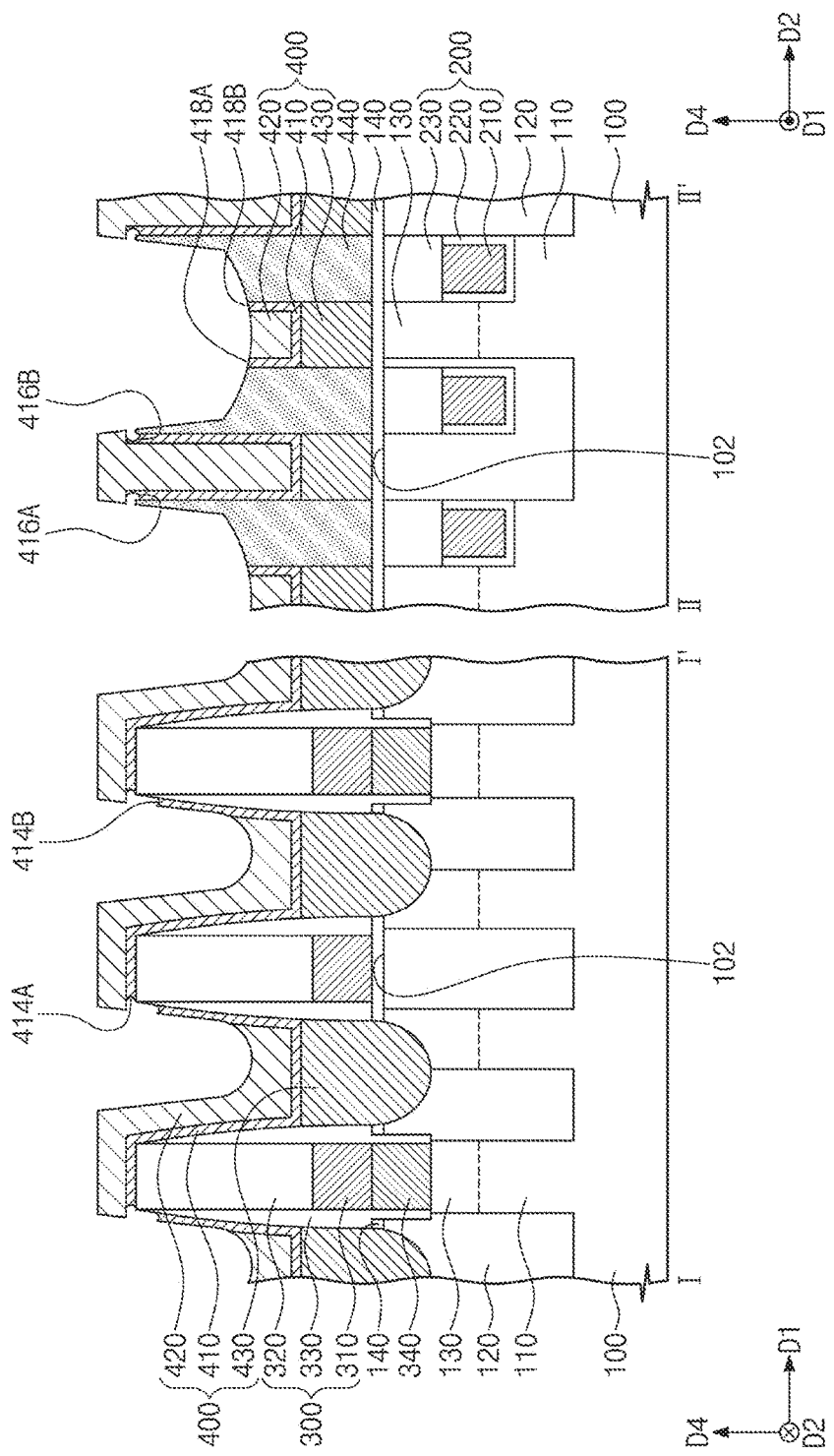

FIGS. 12 to 14 are cross-sectional views corresponding to lines I-I' and II-II' of FIG. 1 for explaining a method for manufacturing a semiconductor device according to some embodiments of the present inventive concepts. Configurations substantially the same as those discussed with reference to FIGS. 1 to 6 may be omitted for brevity of the description. A method for manufacturing a semiconductor device that follows may be substantially the same as that discussed with reference to FIGS. 1 to 6, except for an isotropic etching of the first conductive layer and an etching of the first conductive pattern, the second pattern, and the separation pattern.

Referring to FIG. 12, the first conductive layer 401 on the sidewall of the bit line structure 300 may be exposed when the second conductive layer is etched using the etching mask 10. The etching mask 10 may be formed on substantially the same position as that illustrated in FIG. 3. The second conductive patterns 420 may be electrically connected to the storage node contacts 430 through the first conductive layer 401. An electrical failure may therefore occur in a semiconductor device.

An etching depth of the second conductive layer 402 may be less than that of the second conductive layer 402 discussed with reference to FIG. 5. Differently from that shown in FIG. 5, the etching mask 10 may still remain even after the etch process for the second conductive layer 402 is terminated.

Referring to FIG. 13, the first conductive layer 401 may be isotropically etched. The isotropic etching of the first conductive layer 401 may be substantially the same as the isotropic etching of the first conductive layer 401 discussed with reference to FIG. 6. The isotropic etch process may remove the first conductive layer 401 on the sidewall of the bit line structure 300. As a result, a semiconductor device may be free of the electrical failure.

Referring to FIG. 14, the etching mask 10 may be used to further etch the first conductive pattern 410, the second conductive pattern 420, and the separation pattern 440. Top surfaces of a pair of separation patterns 440 directly adjacent to each other may be coplanar with the fifth and sixth end surfaces 418A and 418B of the first conductive pattern 410 between short sidewalls of the pair of separation patterns 440.

Figure 15:
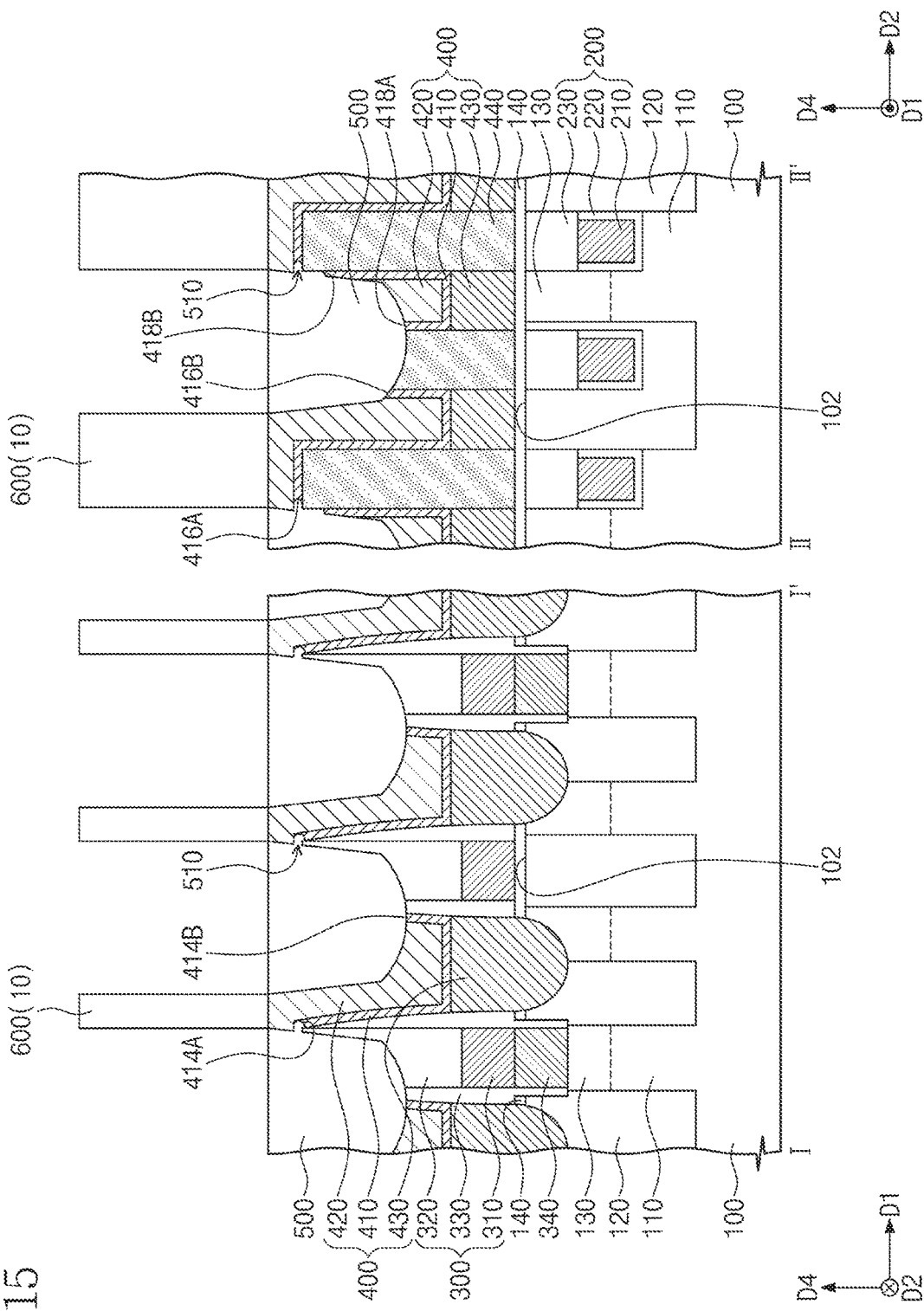
FIG. 15 shows cross-sectional views corresponding to lines I-I' and II-II' of FIG. 7 illustrating a semiconductor device according to some embodiments of the present inventive concepts.

FIG. 15 shows cross-sectional views corresponding to lines I-I' and II-II' of FIG. 7 illustrating a semiconductor device according to some embodiments of the present inventive concepts. Configurations substantially the same as those discussed with reference to FIGS. 7, 8, and 11 to 14 may be omitted for brevity of the description. A method for manufacturing a semiconductor device that follows may be substantially the same as that discussed with reference to FIGS. 11 to 14, except for the position of the etching mask.

Referring to FIGS. 7 and 15, the etching mask 10 may vertically overlap a pair of contact structures 400 spaced apart from each other along the second direction D2 across the separation pattern 440. The etching mask 10 may vertically overlap a portion of the capping pattern 320. Differently from that shown in FIG. 8, the fourth and fifth end surfaces 416B and 418A may be coplanar with the top surface of the separation pattern 440 between the fourth and fifth end surfaces 416B and 418A. Differently from that shown in FIG. 12, an etch process for the second conductive layer 402 may expose the portion 412 of the first conductive layer 401 on the sidewall of the separation pattern 440. In other words, the first conductive layer 401 may not be etched on the sidewall of the separation pattern 440. The sidewall of the separation pattern 440 may therefore not be exposed.

The second conductive patterns 420 may be electrically connected to the storage node contacts 430 through the first conductive layer 401. An electrical failure may therefore occur in a semiconductor device. The first conductive layer 401 may be removed from the sidewall of the separation pattern 440 by the isotropic etch process for the first conductive layer 401 discussed with reference to FIG. 13. As a result, a semiconductor device may be free of the electrical failure. The etching mask 10 may be used to further etch the first conductive pattern 410, the second conductive pattern 420, and the separation pattern 440.

Figure 16:
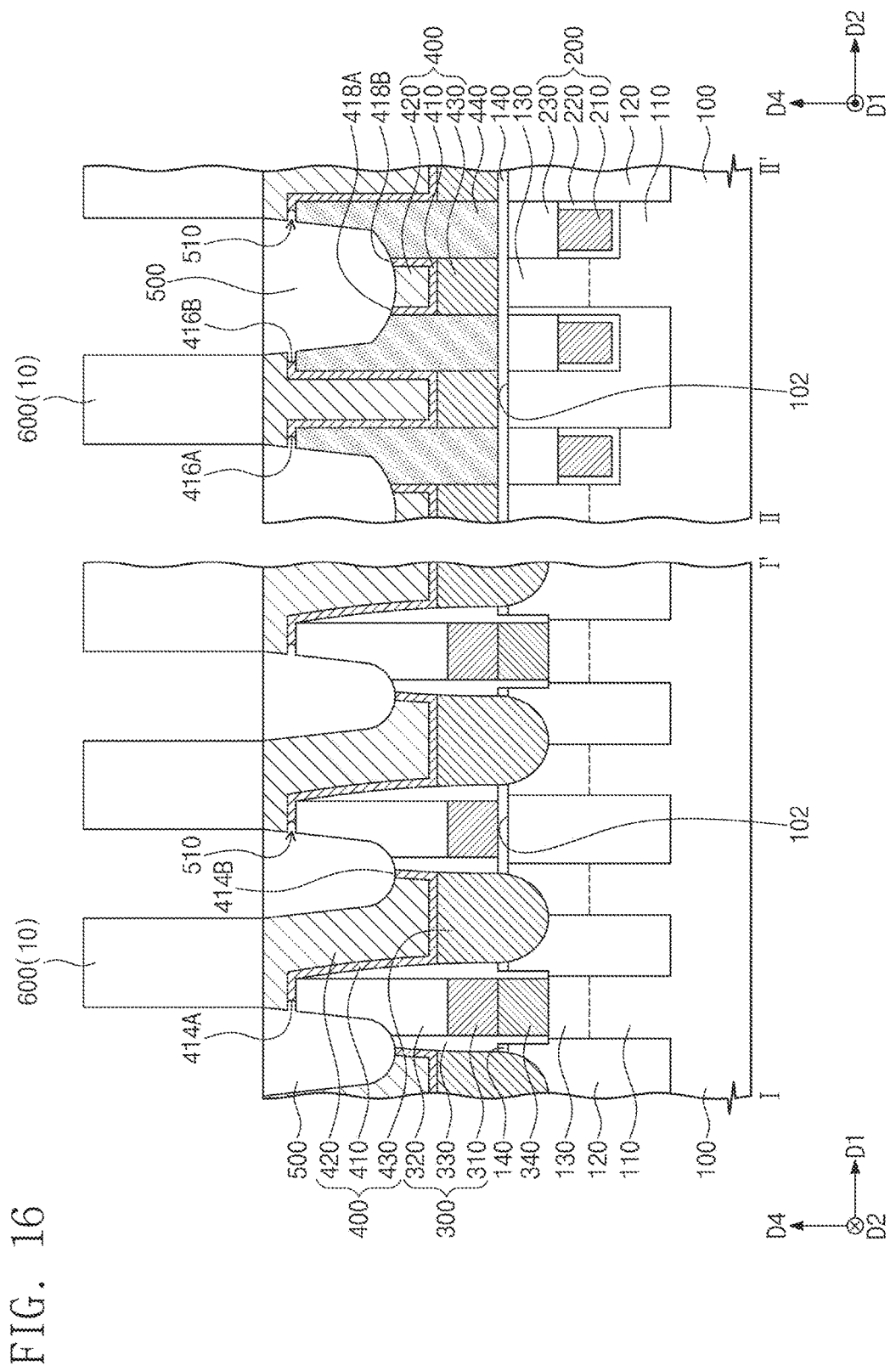
FIG. 16 shows cross-sectional views corresponding to lines I-I' and II-II' of FIG. 9 illustrating a semiconductor device according to some embodiments of the present inventive concepts.

FIG. 16 shows cross-sectional views corresponding to lines I-I' and II-II' of FIG. 9 illustrating a semiconductor device according to some embodiments of the present inventive concepts. Configurations substantially the same as those discussed with reference to FIGS. 9, 10, and 11 to 14 may be omitted for brevity of the description. A method for manufacturing a semiconductor device that follows may be substantially the same as that discussed with reference to FIGS. 11 to 14, except for the position of the etching mask.

Referring to FIGS. 9 and 16, the etching mask 10 may vertically overlap a portion of the capping pattern 320 and a portion of the separation pattern 440. Differently from that shown in FIG. 10, the second end surface 414B may be coplanar with top surfaces of the second conductive pattern 420 and the spacer 330 directly adjacent to the second end surfaces 414B. The fifth end surface 418A may be coplanar with top surfaces of the separation pattern 440 and the second conductive pattern 420 directly adjacent to the fifth end surface 418A. The sixth end surface 418B may be coplanar with top surfaces of the separation pattern 440 and the second conductive pattern 420 directly adjacent to the sixth end surface 418B. Top surfaces of a pair of separation patterns 440 directly adjacent to each other may be coplanar with the fifth and sixth end surfaces 418A and 418B of the first conductive pattern 410 between short sidewalls of the pair of separation patterns 440. Differently from that shown in FIG. 12, the first and second conductive layers 401 and 402 may be etched to form the first and second conductive patterns 410 and 420, respectively. The first conductive pattern 410 may be isotropically etched. The isotropic etching of the first conductive pattern 410 may be substantially the same as the process discussed with reference to FIG. 13. The etching mask 10 may be used to further etch the first conductive pattern 410, the second conductive pattern 420, and the separation pattern 440.

Figure 17:
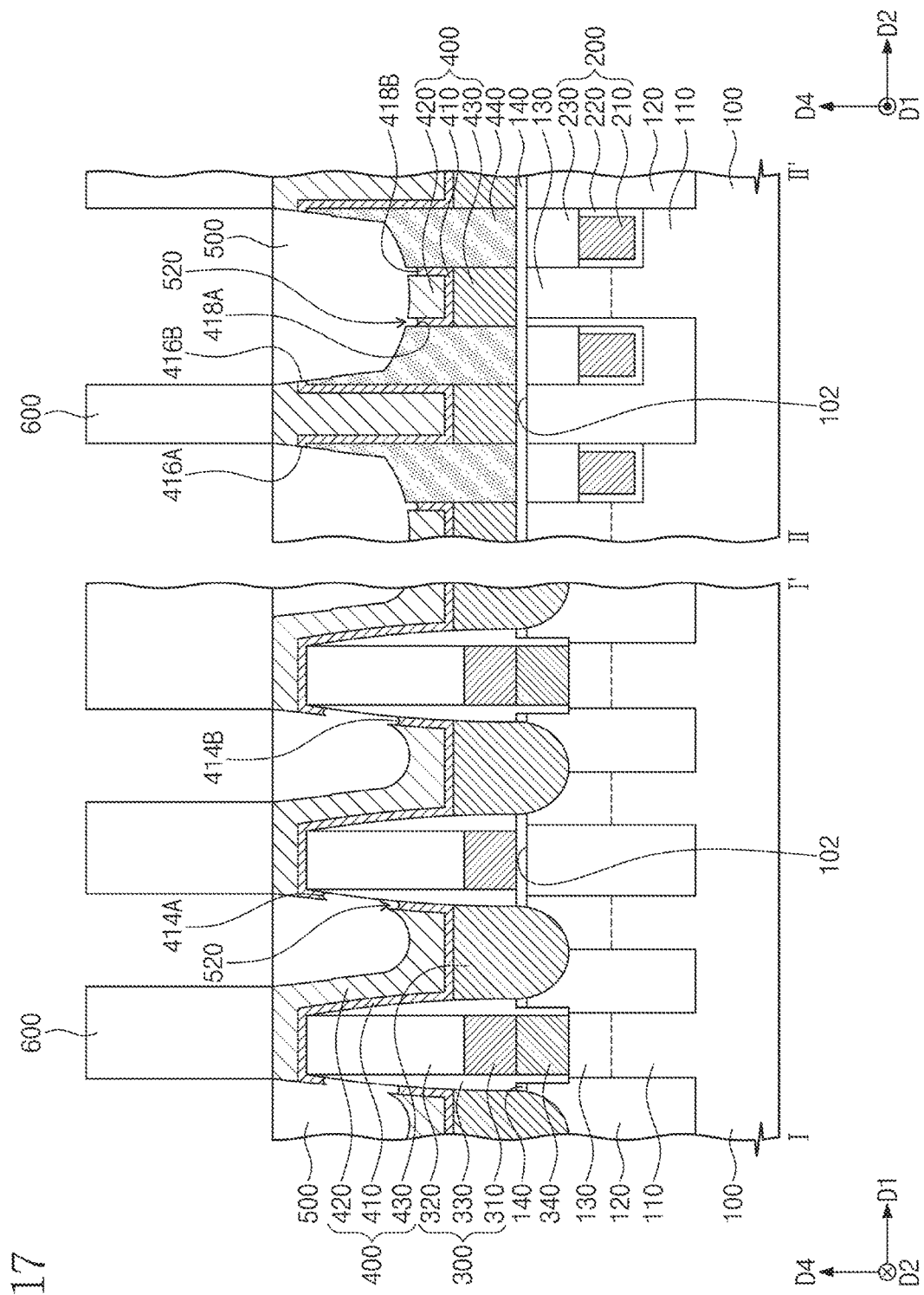
FIG. 17 shows cross-sectional views corresponding to lines I-I' and II-II' of FIG. illustrating a semiconductor device according to some embodiments of the present inventive concepts.

FIG. 17 shows cross-sectional views corresponding to lines I-I' and II-II' of FIG. 1 illustrating a semiconductor device according to some embodiments of the present inventive concepts. Configurations substantially the same as those discussed with reference to FIGS. 1 to 6 may be omitted for brevity of the description.

Referring to FIGS. 1 and 17, the substrate 100 may be provided thereon with the bit line structures 300, the contact structures 400, the separation patterns 440, the insulation pattern 500, and the data storage elements 600. Detailed description about configurations except for shapes of the first conductive pattern 410 and the insulation pattern 500 may be substantially the same as those discussed with FIGS. 1 and 2.

Differently from that shown in FIG. 2, the first conductive pattern 410 may extend on or cover the top surface of the bit line structure 300 and extend onto the sidewall of the bit line structure 300. The first end surface 414A of the first conductive pattern 410 may be disposed on the sidewall of the bit line structure 300. The second conductive pattern 420 may include sidewalls coplanar with the third and fourth end surfaces 416A and 416B of the first conductive pattern 410 between a pair of separation patterns 440 directly adjacent to each other.

The insulation pattern 500 may include the second protrusions 520 vertically protruding from the bottom and top surfaces thereof and laterally extending towards the spacers 330. Differently from that shown in FIG. 2, the insulation pattern 500 may have no first protrusions 510 horizontally or laterally protruding from the sidewall thereof.

FIGS. 18 to 21 are cross-sectional views corresponding to lines and of FIG. 3 for explaining a method for manufacturing a semiconductor device according to some embodiments of the present inventive concepts. Configurations substantially the same as those discussed with reference to FIGS. 1 to 6 may be omitted for brevity of the description. A method for manufacturing a semiconductor device that follows may be substantially the same as that discussed with reference to FIGS. 1 to 6, except for a process for forming of an etch stop spacer, a process for isotropically etching of the first conductive layer, and a process for etching of the first conductive pattern, the second pattern, and the separation pattern.

Figure 18:
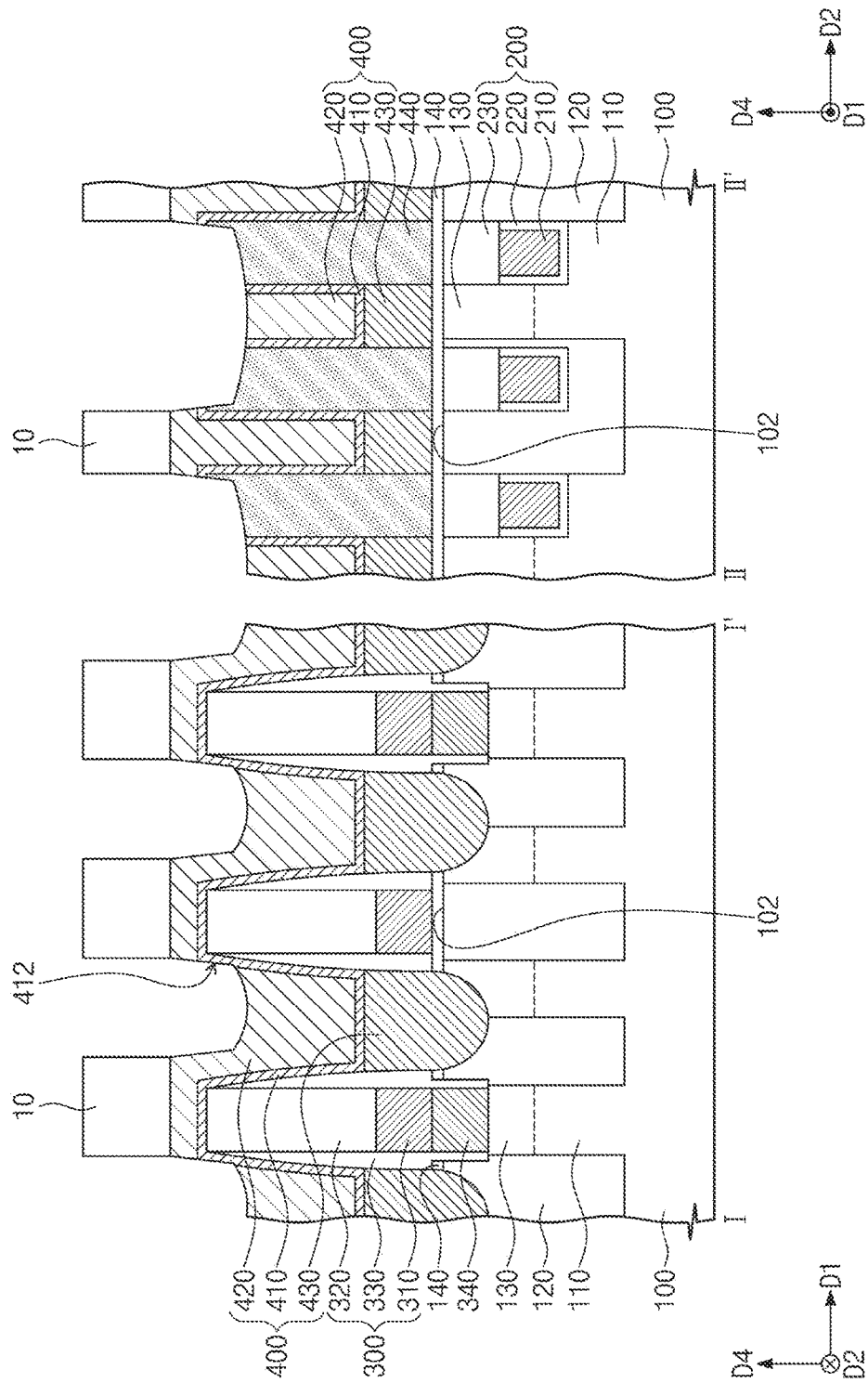
FIGS. 18 to 21 are cross-sectional views corresponding to lines I-I' and II-II' of FIG. 3 for explaining a method for manufacturing a semiconductor device according to some embodiments of the present inventive concepts.

Referring to FIG. 18, the first conductive layer 401 on the sidewall of the bit line structure 300 may be exposed when the second conductive layer is etched using the etching mask 10. The etching mask 10 may be formed on substantially the same position as that illustrated in FIG. 3. The second conductive patterns 420 may be electrically connected to the storage node contacts 430 through the first conductive layer 401. An electrical failure may therefore occur in a semiconductor device.

An etching depth of the second conductive layer 402 may be less than that of the second conductive layer 402 discussed with reference to FIG. 5. Differently from that shown in FIG. 5, the etching mask 10 may still remain even after the etch process for the second conductive layer 402 is terminated.

Figure 19:
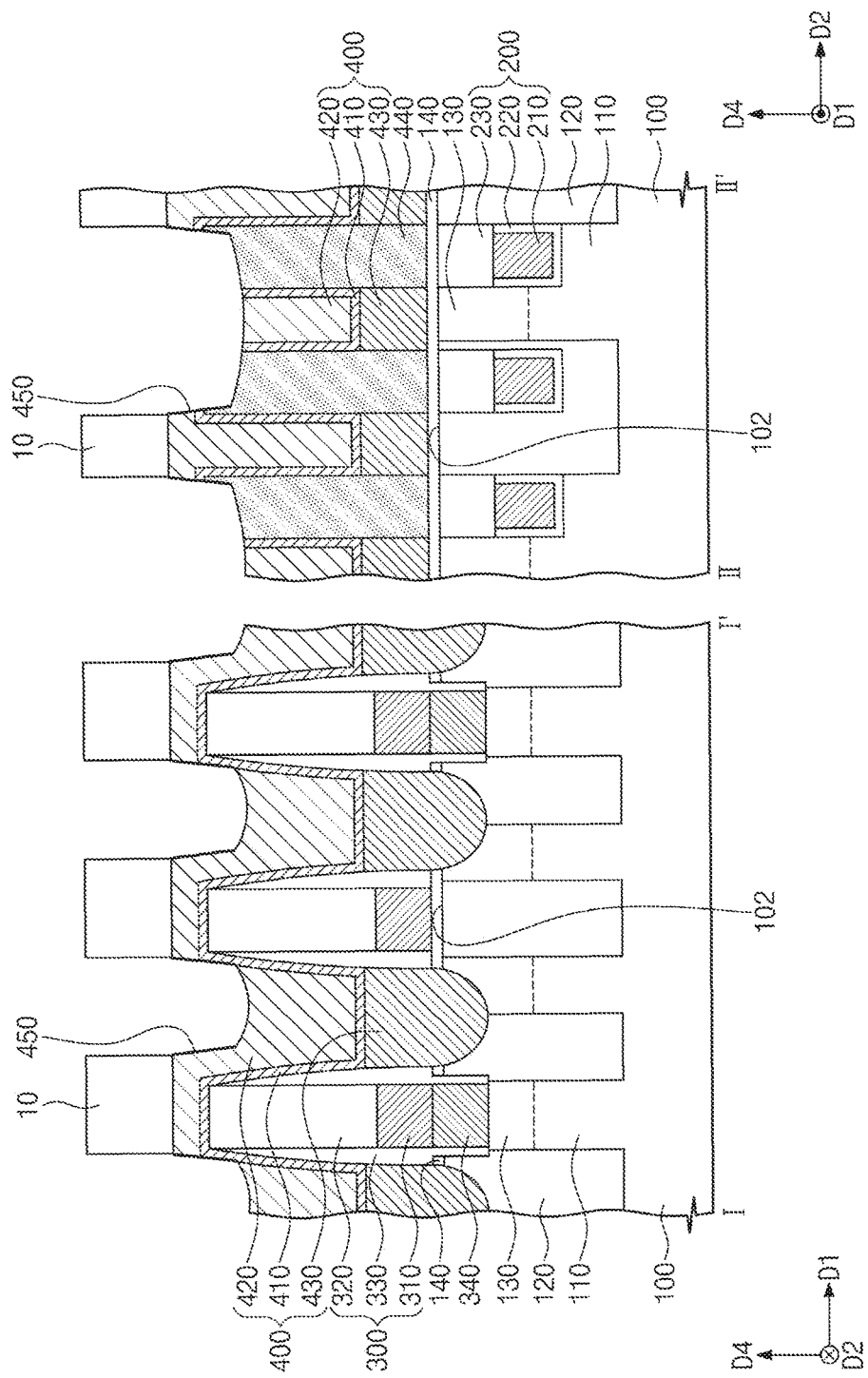

Referring to FIG. 19, the sidewalls of the second conductive patterns 420, the first conductive layer 401, and the separation patterns 440 may be exposed as discussed with reference to FIG. 18. Etch stop spacers 450 may be formed on the exposed sidewalls of the second conductive patterns 420, the first conductive layer 401, and the separation patterns 440. The etch stop spacers 450 may prevent the first conductive layer 401 from being etched. The etch stop spacers 450 may include an insulative material. For example, the etch stop spacers 450 may include silicon oxide, silicon nitride, silicon oxynitride, or any combination thereof. The formation of the etch stop spacers 450 may include a process for forming an etch stop layer on the etching mask 10, the second conductive pattern 420, the first conductive layer 401, and the separation patterns 440, and a process (e.g., an etch back process) for etching the etch stop layer.

Figure 20:
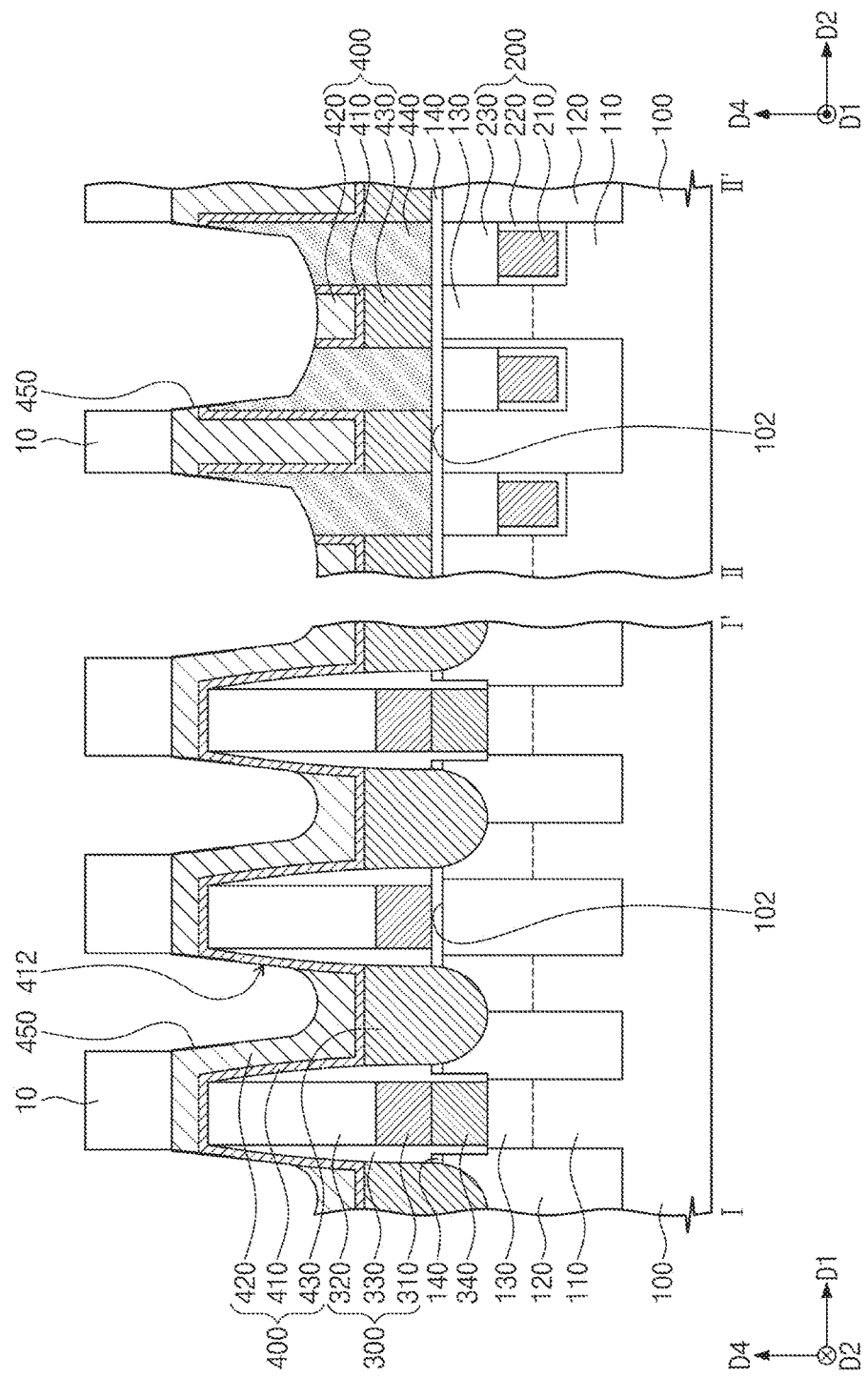

Referring to FIG. 20, a process may be performed to etch the first conductive layer 401, the second conductive patterns 420, and the separation patterns 440. For example, a dry etch process using the etching mask 10 may be employed to etch the first conductive layer 401, the second conductive patterns 420, and the separation patterns 440. The etch process may expose the portion 412 of the first conductive layer 401 on the sidewall of the bit line structure 300.

Figure 21:
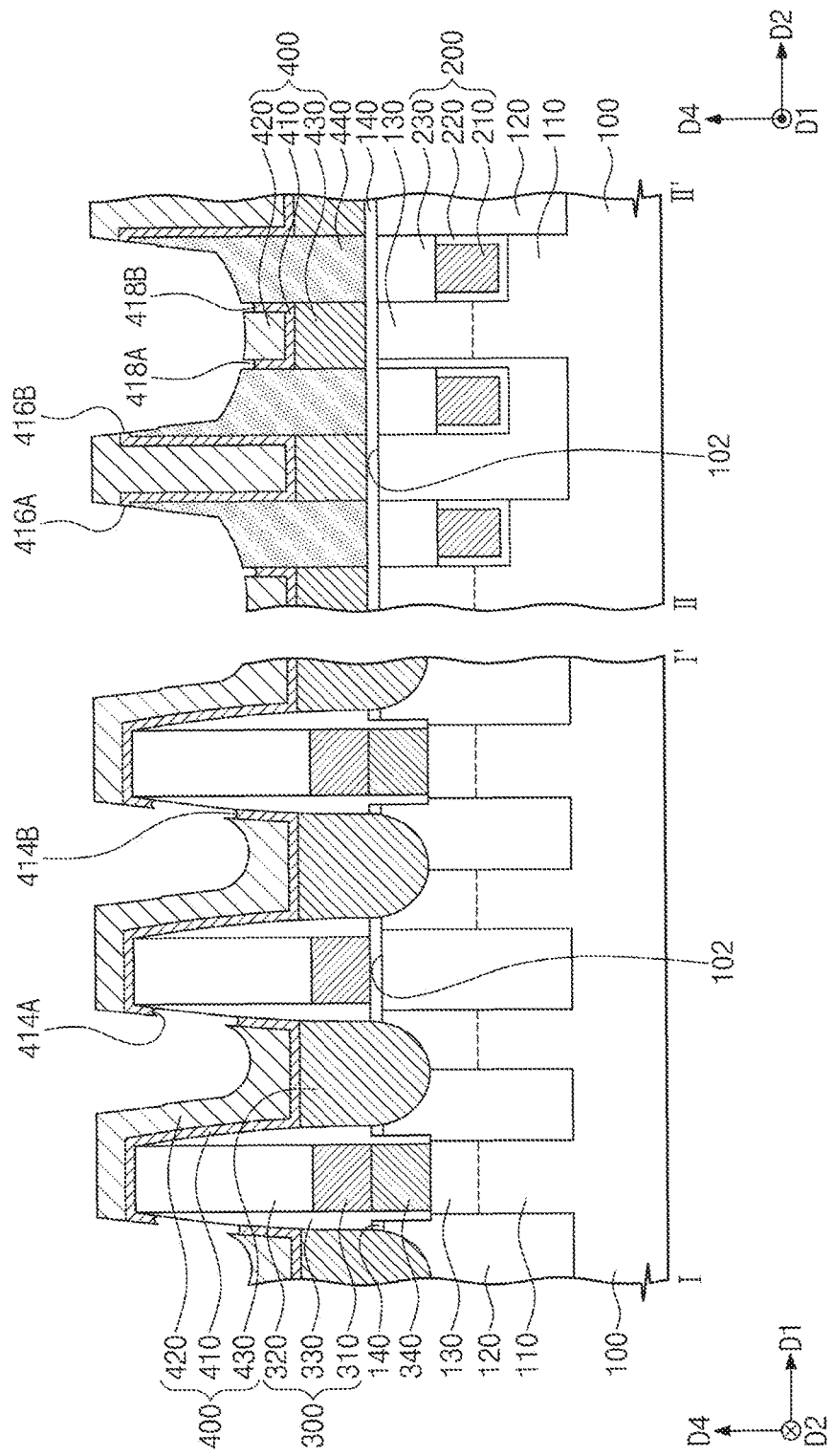

Referring to FIG. 21, the first conductive layer 401 may be isotropically etched such the portion 412 discussed in FIG. 20 may be removed from the first conductive layer 401. As a result, a semiconductor device may be free of the electrical failure. The first conductive layer 401 may be etched by, for example, a wet or dry etch process. In case that a wet etch process is performed to etch the first conductive layer 401, the wet etch process may use an etchant including a material that selectively removes TiN, Ti/TiN, TiSiN, TaN, WN, or any combination thereof. The first conductive pattern 410 may be formed by removing the portion 412 of the first conductive layer 401 on one of the sidewalls of each of the bit line structures 300. After the etch process for removing the portion 412 of the first conductive layer 401, the etch stop spacer 450 and the etching mask 10 may be removed.

Referring back to FIG. 17, the insulation pattern 500 may be formed in areas that are etched by the etch process discussed with reference to FIG. 20. For example, the insulation pattern 500 may fill the etched areas. The formation of the insulation pattern 500 may include forming an insulation layer on the bit line structures 200, the contact structures 400, and the separation patterns 440, and etching the insulation layer to expose top surfaces of the second conductive patterns 420 on the bit line structures 300.

Figure 22:
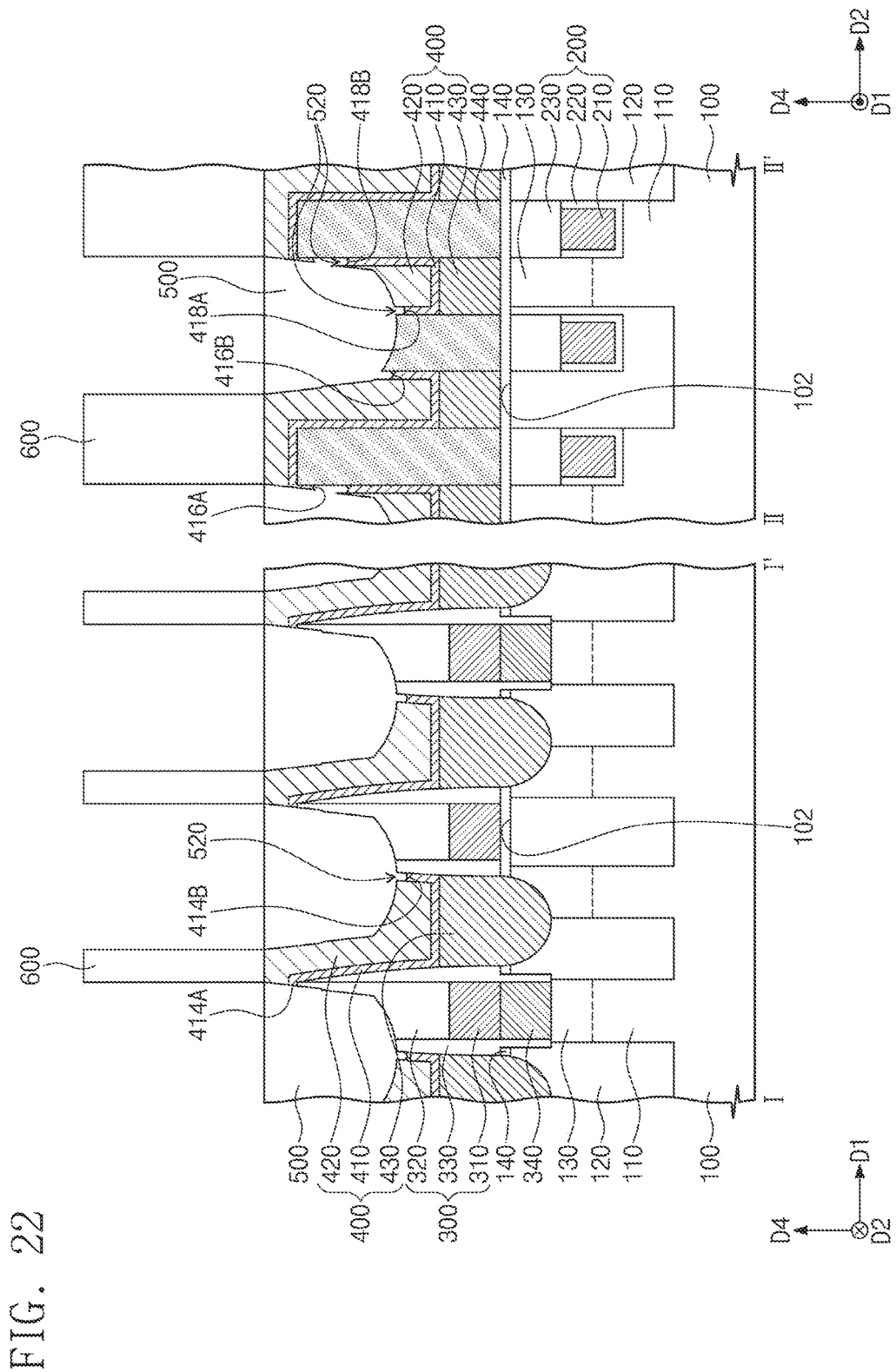
FIG. 22 shows cross-sectional views corresponding to lines I-I' and II-II' of FIG. 7 illustrating a semiconductor device according to some embodiments of the present inventive concepts.

FIG. 22 shows cross-sectional views corresponding to lines I-I' and II-II' of FIG. 7 illustrating a semiconductor device according to some embodiments of the present inventive concepts. Configurations substantially the same as those discussed with reference to FIGS. 7, 8, 17 to 21 may be omitted for brevity of the description. A method for manufacturing a semiconductor device that follows may be substantially the same as that discussed with reference to FIGS. 17 to 21, except for the position of the etching mask.

Referring to FIGS. 7 and 22, the etching mask 10 may vertically overlap a pair of contact structures 400 spaced apart from each other along the second direction D2 across the separation pattern 440. The etching mask 10 may vertically overlap a portion of the capping pattern 320. Differently from that shown in FIG. 8, the first end surface 414A of the first conductive pattern 410 may be coplanar with sidewalls of the second conductive pattern 420 and the capping pattern 320 directly adjacent to the first end surface 414A. The first conductive pattern 410 may extend on or cover the top surface of the separation pattern 440 and extend onto the sidewall of the separation pattern 440. The third end surface 416A of the first conductive pattern 410 may be disposed on the sidewall of the separation pattern 440. Differently from that shown in FIG. 18, an etch process for the second conductive layer 402 may expose the portion 412 of the first conductive layer 401 on the sidewall of each of the separation patterns 440. In other words, the first conductive layer 401 may not be etched on the sidewalls of the separation patterns 440. Therefore, the separation patterns 440 may not be exposed. The second conductive patterns 420 may be electrically connected to the storage node contacts 430 through the first conductive layer 401. An electrical failure may therefore occur in a semiconductor device.

The first conductive layer 401 may be removed from the sidewalls of the separation patterns 440 by the isotropic etch process for the first conductive layer 401 discussed with reference to FIGS. 19 to 21. For example, the isotropic etch process for the first conductive layer 401 may include forming the etch stop spacer 450 on the exposed sidewalls of the first conductive layer 401, further etching the bit line structure 300, the first conductive layer 401, the second conductive pattern 420, and the separation pattern 440, isotropically etching the first conductive layer 401, and removing the etch stop spacer 450. As a result, a semiconductor device may be free of the electrical failure.

Figure 23:
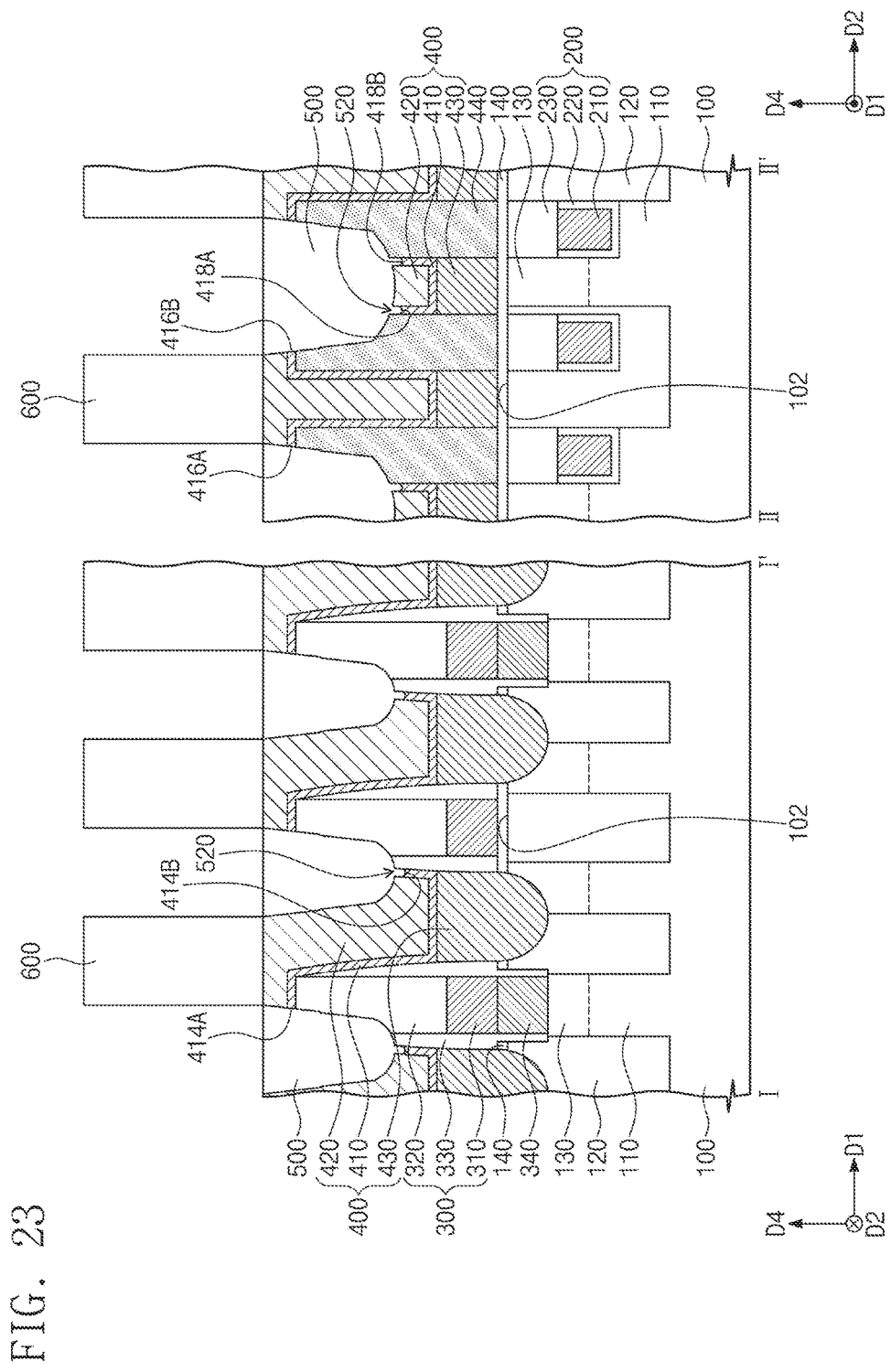
FIG. 23 shows cross-sectional views corresponding to lines I-I' and II-II' of FIG. 9 illustrating a semiconductor device according to some embodiments of the present inventive concepts.

FIG. 23 shows cross-sectional views corresponding to lines I-I' and II-II' of FIG. 9 illustrating a semiconductor device according to some embodiments of the present inventive concepts. Configurations substantially the same as those discussed with reference to FIGS. 9, 10, 17 to 21 may be omitted for brevity of the description. A method for manufacturing a semiconductor device that follows may be substantially the same as that discussed with reference to FIGS. 17 to 21, except for the position of the etching mask.

Referring to FIGS. 9 and 23, the etching mask 10 may vertically overlap a portion of the capping pattern 320 and a portion of the separation pattern 440. Differently from that shown in FIG. 10, the first end surface 414A of the first conductive pattern 410 may be coplanar with sidewalls of the second conductive pattern 420 and the capping pattern 320 directly adjacent to the first end surface 414A. The third end surface 416A of the first conductive pattern 410 may be coplanar with sidewalls of the second conductive pattern 420 and the separation pattern 440 directly adjacent to the third end surface 416A. The fourth end surface 416B of the first conductive pattern 410 may be coplanar with sidewalls of the second conductive pattern 420 and the separation pattern 440 directly adjacent to the fourth end surface 416B. Differently from that shown in FIG. 18, the first and second conductive layers 401 and 402 may be etched to form the first and second conductive patterns 410 and 420, respectively.

Figure 24:
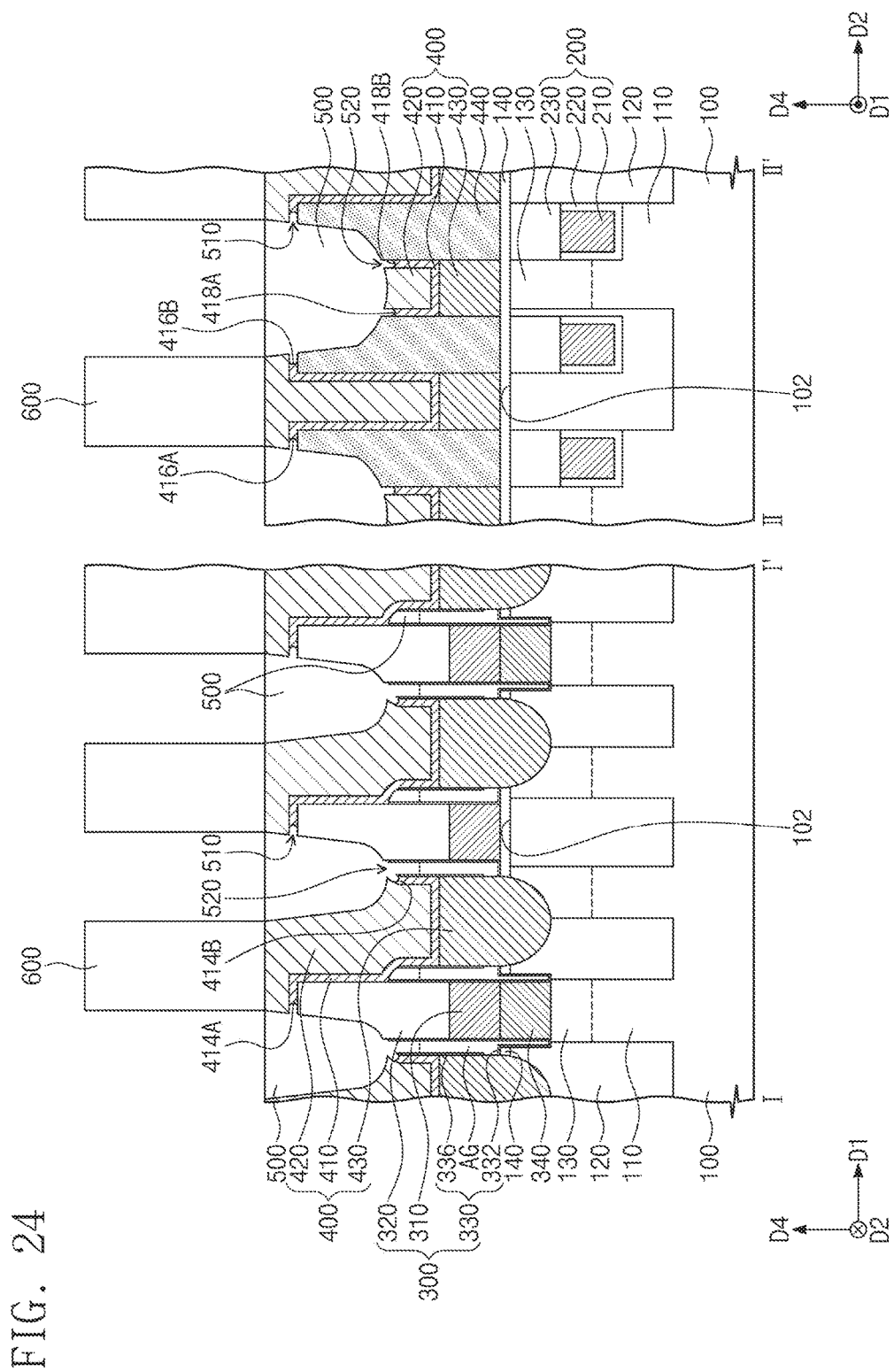
FIG. 24 shows cross-sectional views corresponding to lines I-I' and II-II' of FIG. 9 illustrating a semiconductor device according to some embodiments of the present inventive concepts.

FIG. 24 shows cross-sectional views corresponding to lines I-I' and II-II' of FIG. 9 illustrating a semiconductor device according to some embodiments of the present inventive concepts. Configurations substantially the same as those discussed with reference to FIGS. 9 and 10 may be omitted for brevity of the description.

Referring to FIG. 24, the bit line structures 300, the contact structures 400, the separation patterns 440, the insulation pattern 500, and the data storage elements 600 may be provided on the substrate 100 including the word line structure 200. A semiconductor device according to the present embodiment may be configured substantially the same as that discussed with reference to FIGS. 9 and 10, except for a spacer 330 and a shape of the second protrusion 520 of the insulation pattern 500.

The spacer 330 may include a first spacer 332, a second spacer 336, and an air gap AG between the first and second spacers 332 and 336. The first spacer 332 may conformally extend on or cover the sidewall of the capping pattern 320, the sidewall of the bit line pattern 310, the sidewall of the bit line node contact 340, the top surface 102 and sidewall of the substrate 100, and the top surface and sidewall of the buffer layer 140. The second spacer 336 may conformally extend on or cover the lower sidewall of the contact structure 400. The first and second spacers 332 and 336 may be spaced apart from each other across the air gap AG. The air gap AG may be defined by sidewalls of the first and second spacers 332 and 336, the sidewall of the storage node contact 430, and a bottom surface of the second protrusion 520 included in the insulation pattern 500. The first and second spacers 332 and 336 may include an insulative material. For example, the first and second spacers 332 and 336 may include silicon nitride.

The second protrusion 520 of the insulation pattern 500 may extend between the first and second spacers 332 and 336. For example, the second protrusion 520 of the insulation pattern 500 may have sidewalls in contact with upper sidewalls of the first and second spacers 332 and 336.

Figure 25:
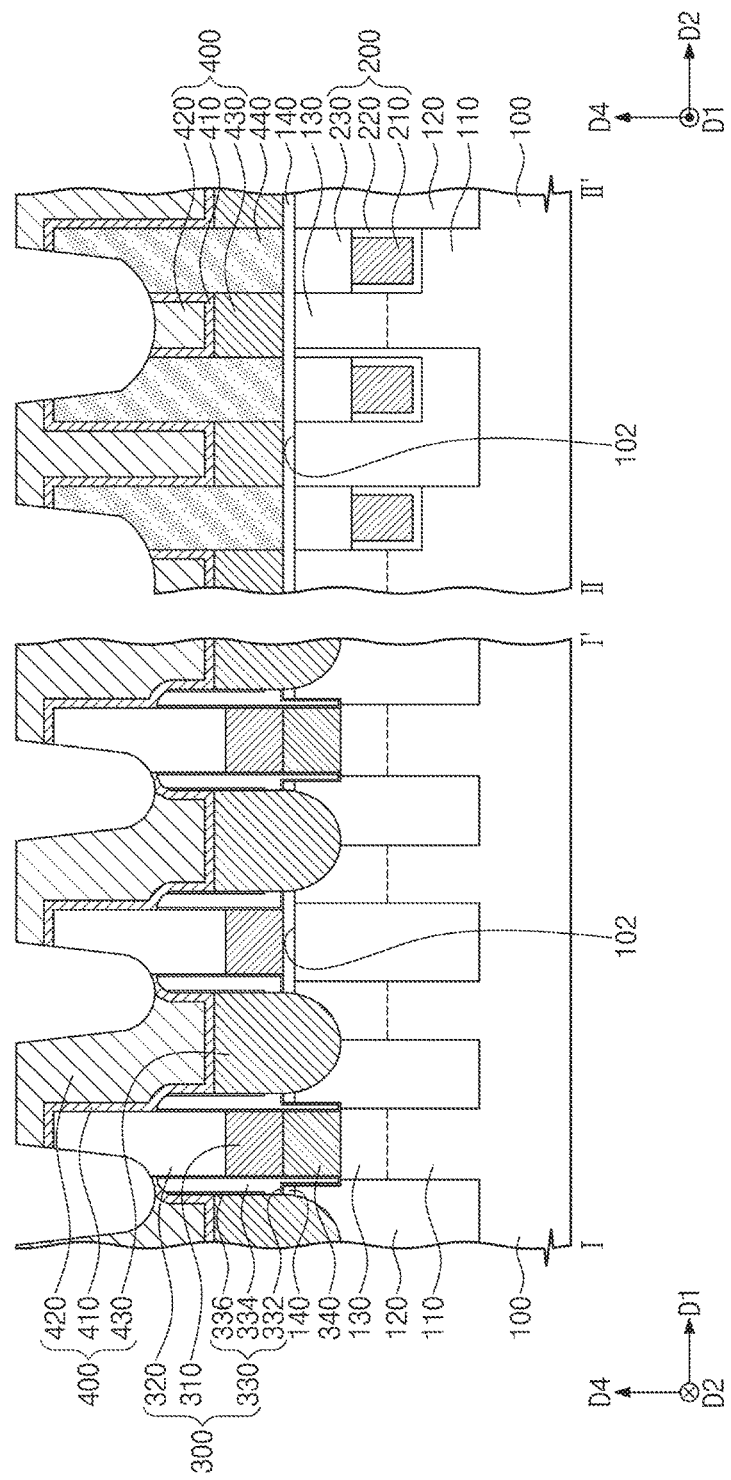
FIGS. 25 to 27 are cross-sectional views corresponding to lines I-I' and II-II' of FIG. 9 for explaining a method for manufacturing a semiconductor device according to some embodiments of the present inventive concepts.
Figure 26:
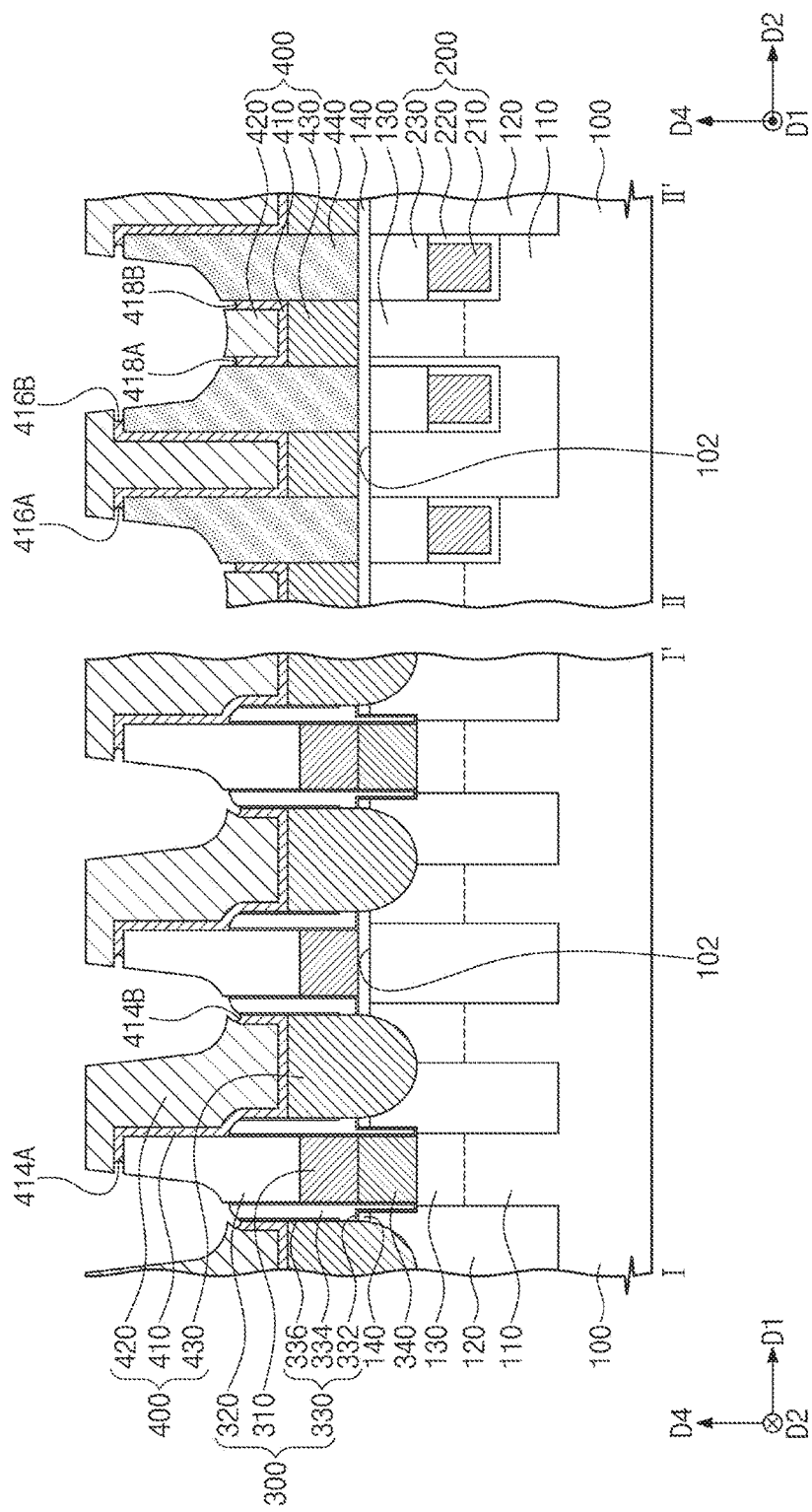
Figure 27:
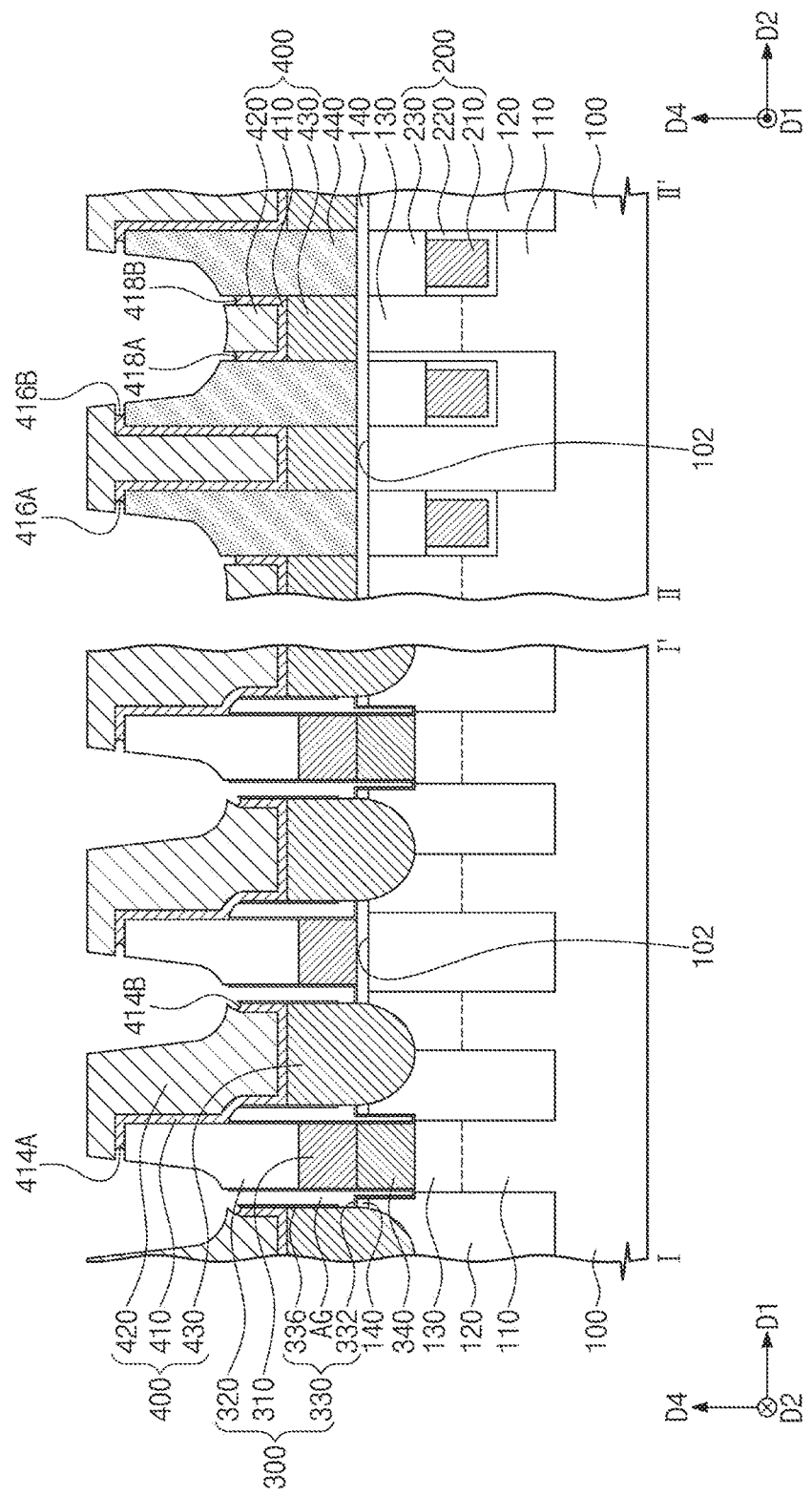

FIGS. 25 to 27 are cross-sectional views corresponding to lines and of FIG. 9 for explaining a method for manufacturing a semiconductor device according to some embodiments of the present inventive concepts. Configurations substantially the same as those discussed with reference to FIGS. 9 and 10 may be omitted for brevity of the description.

Referring to FIG. 25, the bit line structure 300 and the contact structure 400 may be formed on the substrate 100 including the word line structure 200. A method for manufacturing a semiconductor device may be substantially the same as that discussed with reference to FIGS. 9 and 10, except for the spacer 330 and the first conductive pattern 410.

The spacer 330 may include a first spacer 332, a second spacer 336, and a sacrificial spacer 334 between the first and second spacers 332 and 336. The formation of the first spacer 332, the second spacer 336, and the sacrificial spacer 334 may include a process for conformally depositing a first spacer layer, a second spacer layer, a sacrificial spacer layer on the substrate 100 and the bit line structure 300, and a process (e.g., an etch back process) for etching the first spacer layer, the second spacer layer, and the sacrificial spacer layer. The spacer 330 may have a top surface positioned lower than the top surface of the capping pattern 320. In other words, the spacer 330 may extend on or cover a lower sidewall of the capping pattern 320. For example, the first and second spacer layers may include silicon nitride. The sacrificial spacer layer may include an insulative material having an etch selectivity with respect to the first and second spacer layers. For example, the sacrificial layer may include silicon oxide.

The first conductive pattern 410 may extend on or cover an upper sidewall and the top surface of the spacer 330. In case that an etch process is performed on the sacrificial spacer 334, the sacrificial spacer 334 may not be etched due to the first conductive pattern 410 covering the sacrificial spacer 334.

Referring to FIG. 26, the first conductive pattern 410 may be isotropically etched to expose the top surface of the spacer 330. The isotropic etching of the first conductive pattern 410 may be carried out substantially the same as that discussed with reference to FIGS. 9 and 10.

Referring to FIG. 27, the sacrificial spacer 334 may be removed. The sacrificial spacer 334 may be removed using an etch recipe having an etch selectivity with respect to the sacrificial spacer 334. The sacrificial spacer 334 may be removed by a dry or wet etch process. The removal of the sacrificial spacer 334 may expose sidewalls of the first and second spacers 332 and 336.

Referring back to FIG. 24, the insulation pattern 500 may be formed between the contact structures 400. The insulation pattern 500 may be substantially the same as the insulation pattern 500 discussed with reference to FIGS. 9 and 10, except for the second protrusion 520. The second protrusion 520 may extend between the first and second spacers 332 and 336. The second protrusion 520 may have a sidewall in contact with upper sidewalls of the first and second spacers 332 and 336. An air gap AG may be formed between the first and second spacers 332 and 336. The data storage elements 600 may be formed on the contact structures 400.

Figure 28:
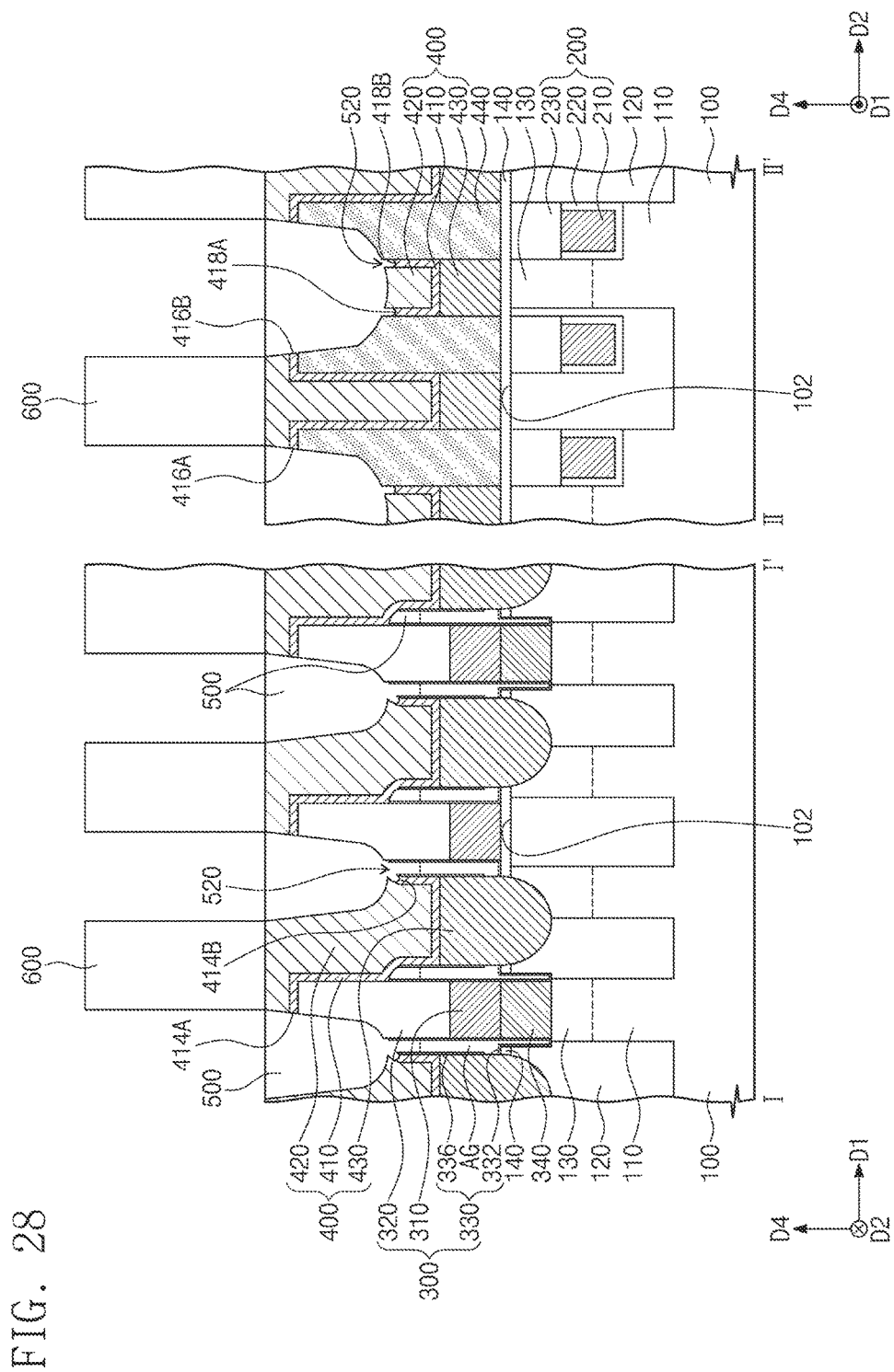
FIG. 28 shows cross-sectional views corresponding to lines I-I' and II-II' of FIG. 9 illustrating a semiconductor device according to some embodiments of the present inventive concepts.

FIG. 28 shows cross-sectional views corresponding to lines I-I' and II-II' of FIG. 9 illustrating a semiconductor device according to some embodiments of the present inventive concepts. Configurations substantially the same as those discussed with reference to FIGS. 9, 10, 18 to 21, and 24 to 27 may be omitted for brevity of the description.

Referring to FIG. 28, the bit line structures 300, the contact structures 400, the separation patterns 440, the insulation pattern 500, and the data storage elements 600 may be formed on the substrate 100 including the word line structure 200. A semiconductor device according to the present embodiment may be configured substantially the same as that discussed with FIG. 24, except for shapes of the first conductive pattern 410 and the insulation pattern 500.

Differently from that shown in FIG. 24, on the bit line structure 300, the first end surface 414A of the first conductive pattern 410 may be coplanar with the sidewall of the second conductive pattern 420. Differently from that shown in FIG. 24, on the separation pattern 440, the third end surface 416A of the first conductive pattern 410 may be coplanar with sidewalls of the second conductive pattern 420 and the separation pattern 440 directly adjacent to the third end surface 416A. Differently from that shown in FIG. 24, on the separation pattern 440, the fourth end surface 416B of the first conductive pattern 410 may be coplanar with sidewalls of the second conductive pattern 420 and the separation pattern 440 directly adjacent to the fourth end surface 416B.

A method for manufacturing a semiconductor device that follows may be substantially the same as that discussed with reference to FIGS. 25 to 27, except for shapes of the first conductive pattern 410 and the insulation pattern 500. After the formation of the bit line structure 300 and the first and second conductive patterns 410 and 420 discussed with reference to FIG. 25, the etch stop spacer 450 may be formed on the first, the third and fourth end surfaces 414A, 416A, and 416B of the first conductive pattern 410 that are coplanar with the sidewall of the second conductive pattern 420. The etch stop spacer 450 may be formed by a process substantially the same as that discussed with reference to FIG. 19. After that, a process may be performed to remove the sacrificial spacer 334 and the first conductive pattern 410 covering the top surface of the spacer 330. The first conductive pattern 410 and the sacrificial spacer 334 may be removed by a process substantially the same as that discussed with reference to FIGS. 26 and 27. Between the contact structures 400 directly adjacent to each other, the insulation pattern 500 may be formed to fill between the first and second spacers 332 and 336. Differently from that shown in FIG. 24, the insulation pattern 500 may have no first protrusion 510 horizontally or laterally protruding from the sidewall thereof.

Figure 29:
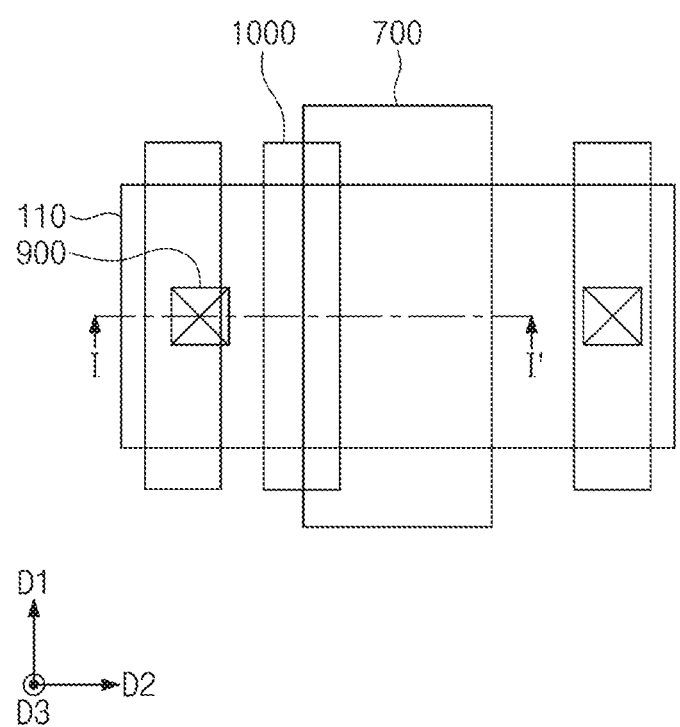
FIG. 29 is a plan view illustrating a semiconductor device according to some embodiments of the present inventive concepts.
Figure 30:
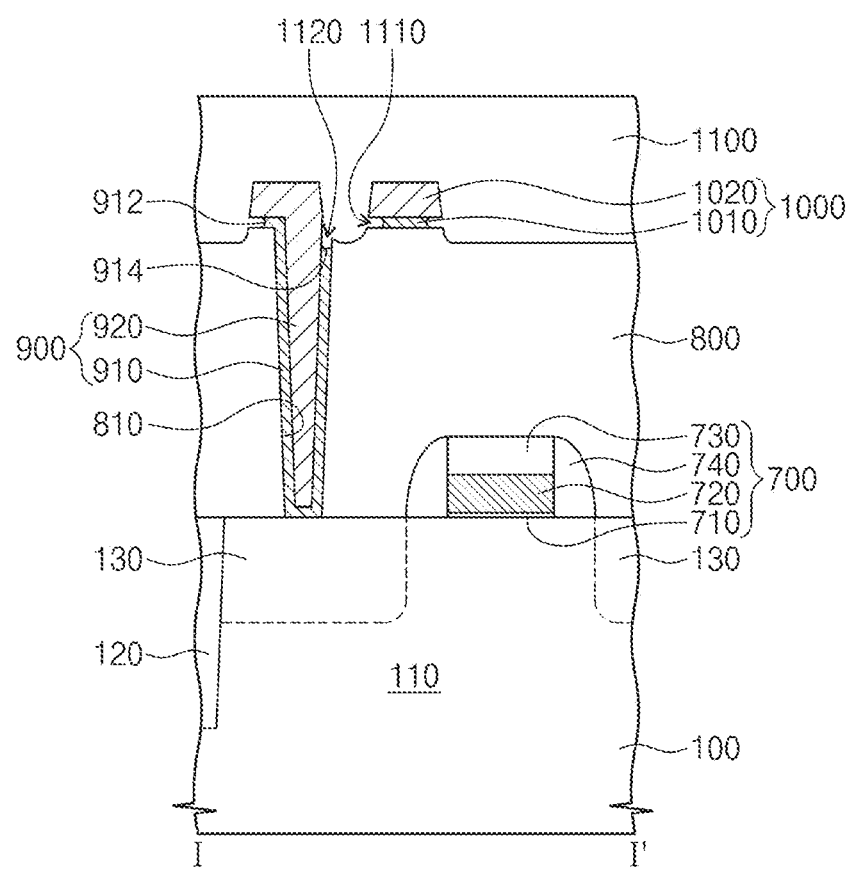
FIG. 30 is a cross-sectional view corresponding to line I-I' of FIG. 29.

FIG. 29 is a plan view illustrating a semiconductor device according to some embodiments of the present inventive concepts. FIG. 30 is a cross-sectional view corresponding to line I-I' of FIG. 29. Configurations substantially the same as those discussed with reference to FIGS. 3 to 6 may be omitted for brevity of the description.

Referring to FIGS. 29 and 30, a gate structure 700 may be provided on a substrate 100. The substrate 100 may be substantially the same as the substrate 100 discussed with reference to FIGS. 1 and 2. The gate structure 700 may include a gate dielectric pattern 710, a gate electrode pattern 720, and a capping pattern 730. The gate structure 700 may further include a gate spacer 740 covering sidewalls of the gate dielectric pattern 710, the gate electrode pattern 720, and the capping pattern 730. The gate dielectric pattern 710, the gate electrode pattern 720, the capping pattern 730, and the gate spacer 740 may include substantially the same material as the gate dielectric layer 220, the word line pattern 210, the capping pattern 230, and the spacer 330, respectively.

The substrate 100 may be provided thereon with a source/drain region 130 spaced apart from the gate structure 700. The source/drain region 130 may have a first conductivity type (e.g., n-type or p-type).

A first insulation layer 800 may be formed on the substrate 100 and the gate structure 700. The first insulation layer 800 may extend on or cover the gate structure 700. The first insulation layer 800 may have therein a contact hole 810 exposing a top surface of the substrate 100. The contact hole 810 may extend along a direction perpendicular to the top surface of the substrate 100.

A first contact structure 900 and a second contact structure 1000 may be formed on the first insulation layer 800. The first and second contact structures 900 and 1000 may be formed by a process substantially the same as the process for forming the contact structure 400 discussed with reference to FIGS. 3 to 6. For example, the formation of the first and second contact structures 900 and 1000 may include a process for forming a first conductive layer, which conformally covers a top surface of the first insulation layer 800 and side and floor surfaces of the contact hole 810, and a second conductive layer on the first conductive layer and a process for patterning the first and second conductive layers. The first and second conductive layers may be substantially the same as the first and second conductive layers 401 and 402, respectively, discussed with reference to FIGS. 3 and 4. The first and second contact structures 900 and 1000 may include first conductive patterns 910 and 1010, respectively, formed by a patterning of the first conductive layer. The first and second contact structures 900 and 1000 may include second conductive patterns 920 and 1020, respectively, formed by a patterning of the second conductive layer.

The first conductive patterns 910 and 1010 may be isotropically etched. The isotropic etching of the first conductive patterns 910 and 1010 may be substantially the same as the process discussed with reference to FIG. 6. The second conductive pattern 920 of the first contact structure 900 may have an end portion that horizontally or laterally is shifted or extends from an first end surface 912 of the first conductive pattern 910. The first conductive pattern 910 of the first contact structure 900 may have an second end surface 914 in the contact hole 810, and the second end surface 914 of the first conductive pattern 910 may be positioned below the top surface of the first insulation layer 800. Therefore, a sidewall of the first insulation layer 800 may be exposed by the first conductive pattern 910. The second conductive pattern 1020 of the second contact structure 1000 may have end portions that horizontally or laterally are shifted or extend from end surfaces of the first conductive pattern 1010 of the second contact structure 1000.

The first insulation layer 800 may be provided thereon with a second insulation layer 1100 covering the first and second contact structures 900 and 1000. The second insulation layer 1100 may include first protrusions 1110 horizontally or laterally protruding from a lower sidewall thereof and a second protrusion 1120 vertically protruding from a bottom surface thereof. The first protrusions 1110 may be formed between the top surface of the first insulation layer 800 and the second conductive patterns 920 and 1020. The second protrusion 1120 may be formed between the sidewall of the first insulation layer 800 and the second conductive pattern 920 of the first contact structure 900.

An isotropic etch process may be performed on the first conductive patterns 910 and 1010, so that the first and second contact structures 900 and 1000 may be spaced apart from each other as needed.

Figure 31:
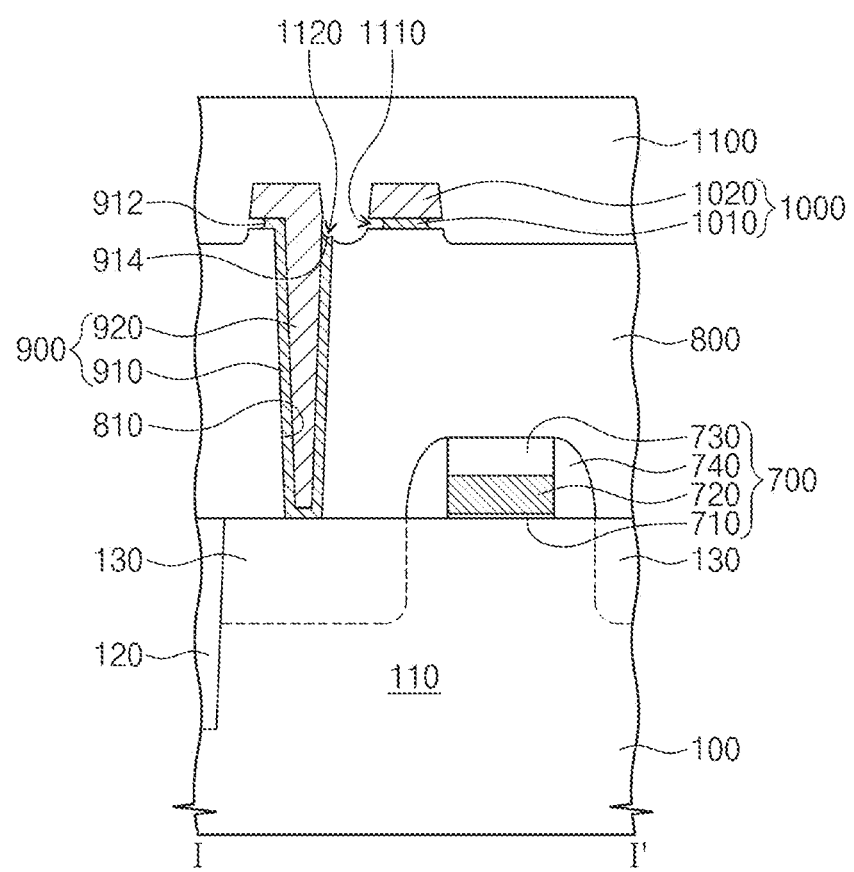
FIG. 31 is a cross-sectional view corresponding to line I-I' of FIG. 29 illustrating a semiconductor device according to some embodiments of the present inventive concepts.

FIG. 31 is a cross-sectional view corresponding to line I-I' of FIG. 29 illustrating a semiconductor device according to some embodiments of the present inventive concepts. Configurations substantially the same as those discussed with reference to FIGS. 12 to 14, 29 and 30 may be omitted for brevity of the description.

Referring to FIG. 31, the substrate 100 may be provided thereon with the gate structure 700, the first insulation layer 800, the first contact structure 900, the second contact structure 1000, and the second insulation layer 1100. A semiconductor device according to the present embodiment may be configured substantially the same as that discussed with reference to FIGS. 29 and 30, except for the second protrusion 1120 of the second insulation layer 1100 and its corresponding first conductive pattern 910. The first and second contact structures 900 and 1000 according to the present embodiment may be formed by a process substantially the same as the process for forming the contact structure 400 discussed with reference to FIGS. 12 to 14. For example, the first conductive patterns 910 and 1110 may be isotropically etched as illustrated in FIG. 13. After that, as shown in FIG. 14, a process may be performed to etch the first insulation layer 800 and the first conductive patterns 910 and 1110. Differently from that shown in FIG. 30, the second insulation layer 1100 may have no second protrusion 1120.

Figure 32:
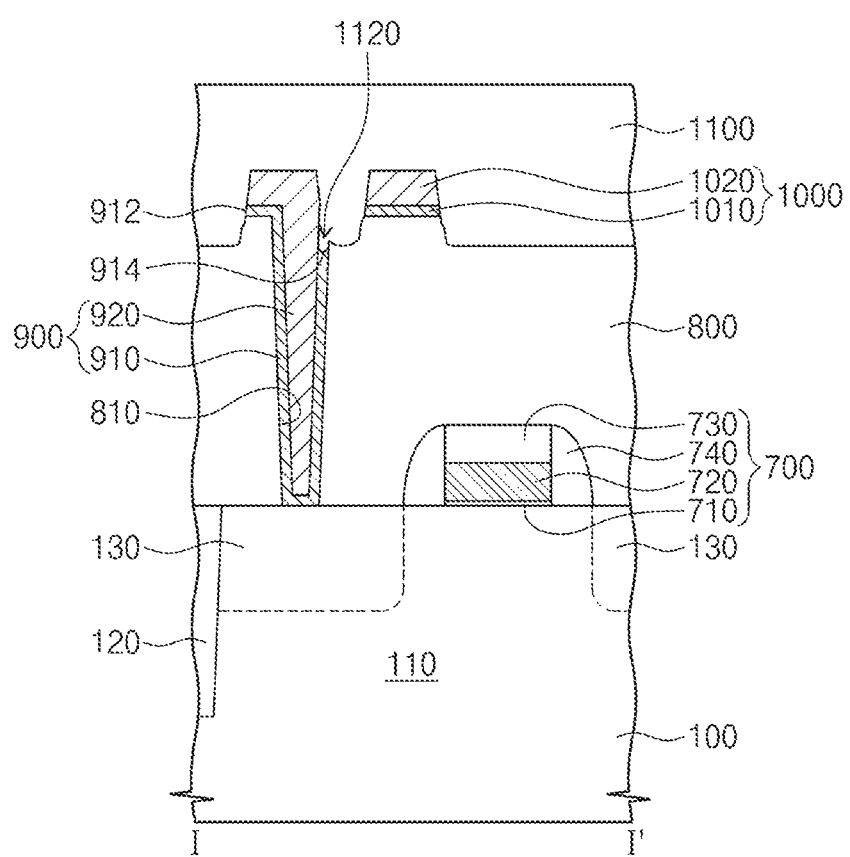
FIG. 32 is a cross-sectional view corresponding to line I-I' of FIG. 29 illustrating a semiconductor device according to some embodiments of the present inventive concepts.

FIG. 32 is a cross-sectional view corresponding to line I-I' of FIG. 29 illustrating a semiconductor device according to some embodiments of the present inventive concepts. Configurations substantially the same as those discussed with reference to FIGS. 18 to 21, 29 and 30 may be omitted for brevity of the description.

Referring to FIG. 32, the substrate 100 may be provided thereon with the gate structure 700, the first insulation layer 800, the first contact structure 900, the second contact structure 1000, and the second insulation layer 1100. A semiconductor device according to the present embodiment may be configured substantially the same as that discussed with reference to FIGS. 29 and 30, except for the first protrusions 1110 of the second insulation layer 1100 and their corresponding first conductive patterns 910 and 1010. The first and second contact structures 900 and 1000 according to the present embodiment may be formed by a process substantially the same as the process for forming the contact structure 400 discussed with reference to FIGS. 18 to 21. For example, as shown in FIG. 19, an etch stop spacer may be formed on sidewalls of the first and second contact structures 900 and 1000. After that, as shown in FIGS. 20 and 21, the first insulation layer 800 and the second conductive patterns 920 and 1020 may be etched, and the first conductive pattern 910 in the contact hole 810 may be isotropically etched. The etch stop spacer may be removed after etching the first conductive pattern 910. Differently from that shown in FIG. 30, the second insulation layer 1100 may have no first protrusion horizontally or laterally protruding from the lower sidewall thereof.

According to some embodiments of the present inventive concepts, the first conductive layer may be isotropically etched. The isotropic etching may remove the first conductive layer that can induce device failure resulting from the electrical connection of contact structures to each other through the first conductive layer. As a result, it may be possible to provide a semiconductor device having high reliability. Effects of the present inventive concepts are, however, not limited to those mentioned above.

The terminology used herein is for the purpose of describing particular embodiments only and is not intended to be limiting of example embodiments. It will be understood that when a layer is referred to as being "on" or "connected to" or "adjacent" another element (e.g., a layer or substrate), it can be directly on or connected to or adjacent the other element, or intervening elements may also be present. In contrast, when an element is referred to as being "directly on" or "directly connected to" or "immediately adjacent" another element, there are no intervening elements present.

It will also be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar references herein are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "and/or" includes any and all combinations of one or more of the associated listed items.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concepts.

The aforementioned description provides some embodiments for explaining the present inventive concepts. Therefore, the present inventive concepts is not limited to the embodiments described above, and it will be understood by one of ordinary skill in the art that variations in form and detail may be made therein without departing from the spirit and essential features of the inventive concepts.

What is claimed is:
1. A semiconductor device, comprising:
a substrate;
a bit line structure on the substrate;
a first contact structure on a sidewall of the bit line structure;

a second contact structure on the bit line structure and spaced apart from the first contact structure across the bit line structure; and an insulation pattern between the bit line structure and the first contact structure, wherein the second contact structure extends on at least a portion of a top surface of the bit line structure, and wherein the insulation pattern comprises a protrusion that protrudes from a sidewall of the insulation pattern that is immediately adjacent the bit line structure, the protrusion protruding in a first direction parallel to a top surface of the substrate.

2. The semiconductor device of claim 1, wherein the protrusion of the insulation pattern is provided between the second contact structure and the top surface of the bit line structure.

3. The semiconductor device of claim 2, wherein:
the second contact structure comprises a first conductive pattern and a second conductive pattern on the first conductive pattern, and
the protrusion of the insulation pattern has a same thickness as the first conductive pattern of the second contact structure.

4. The semiconductor device of claim 3, wherein the first conductive pattern of the second contact structure covers the at least a portion of the top surface and the sidewall of the bit line structure.

5. The semiconductor device of claim 3, wherein:
the protrusion of the insulation pattern comprises a convex end portion, and
the first conductive pattern of the second contact structure comprises a concave end portion corresponding to the convex end portion of the protrusion of the insulation pattern.

6. The semiconductor device of claim 5, wherein:
the first conductive pattern of the second contact structure comprises a first end surface adjacent the top surface of the bit line structure, and
the first end surface is laterally shifted relative to the sidewall of the bit line structure and exposes the top surface of the bit line structure.

7. The semiconductor device of claim 3, wherein:
the bit line structure comprises a bit line pattern, a capping pattern on the bit line pattern, and a spacer on sidewalls of the bit line pattern and the capping pattern, and
the protrusion of the insulation pattern is in contact with the first and second conductive patterns of the second contact structure and with the capping pattern of the bit line structure.

8. The semiconductor device of claim 7, wherein the spacer of the bit line structure is contact with the sidewall of the insulation pattern that is immediately adjacent the bit line structure.

9. A semiconductor device, comprising:
a substrate;
a bit line structure on the substrate;
a first contact structure on a sidewall of the bit line structure;
a second contact structure on the bit line structure and spaced apart from the first contact structure across the bit line structure; and
an insulation pattern between the bit line structure and the first contact structure,
wherein the second contact structure extends on at least a portion of a top surface of the bit line structure, and
wherein the insulation pattern comprises a protrusion between the bit line structure and the first contact structure, the protrusion protruding from a bottom surface of the insulation pattern toward the substrate.

10. The semiconductor device of claim 9, wherein:
the bit line structure comprises a bit line pattern, a capping pattern on the bit line pattern, and a spacer on a sidewall of the bit line pattern and on a sidewall of the capping pattern, and
the protrusion of the insulation pattern is contact with a sidewall of the spacer.

11. The semiconductor device of claim 10, wherein the spacer comprises:
a first spacer in contact with the sidewall of the bit line pattern and the sidewall of the capping pattern;
a second spacer in contact with a lower sidewall of the first contact structure; and
an air gap between the first and second spacers.

12. The semiconductor device of claim 11, wherein the protrusion of the insulation pattern extends between the first and second spacers.

13. The semiconductor device of claim 12, wherein the protrusion of the insulation pattern comprises sidewalls in contact with facing sidewalls of the first and second spacers.

14. The semiconductor device of claim 10, wherein:
a first conductive pattern of the first contact structure comprises an end surface adjacent the sidewall of the spacer, and
the end surface is vertically shifted relative to a top surface of the spacer and exposes the sidewall of the spacer.

15. The semiconductor device of claim 9, wherein:
the first contact structure comprises a first conductive pattern and a second conductive pattern on the first conductive pattern, and
the protrusion of the insulation pattern comprises a convex end portion that is in contact with a concave end portion of the first conductive pattern of the first contact structure.

16. A semiconductor device, comprising:
a substrate including conductive contact structures thereon, the conductive contact structures respectively comprising a first conductive pattern and a second conductive pattern of a different material than the first conductive pattern stacked thereon; and
an asymmetric insulation pattern electrically isolating the conductive contact structures from one another, the asymmetric insulation pattern comprising a protrusion laterally extending from a first sidewall surface thereof into the first conductive pattern of one of the conductive contact structures, wherein a second sidewall surface of the asymmetric insulation pattern opposite the first sidewall surface is free of protrusions and extends along the second conductive pattern of another of the conductive contact structures.

17. The device of claim 16, wherein a dimension of the protrusion is the same as a thickness of the first conductive pattern, and wherein the protrusion comprises a convex portion that directly contacts a corresponding concave portion of the first conductive pattern.

18. The device of claim 17, further comprising:
bit line structures extending along the substrate and storage node contacts therebetween, the bit line structures respectively comprising a conductive bit line and an insulating layer thereon;
wherein the conductive contact structures electrically connect the storage node contacts to data storage structures, respectively, wherein the asymmetric insulation pattern is between the bit line structures, and wherein the protrusion directly contacts the insulating layer of one of the bit line structures adjacent the first sidewall surface of the asymmetric insulation pattern.

19. The device of claim 18, wherein the protrusion laterally extends between the second conductive pattern of the one of the conductive contact structures and a top surface of the insulating layer of the one of the bit line structures.

20. The device of claim 16, wherein the asymmetric insulation pattern further comprises a second protrusion extending from the first sidewall surface thereof towards the substrate, and wherein the first conductive patterns of the conductive contact structures comprise portions of a same barrier metal layer that are electrically isolated by the first and second protrusions.

* * * * *